US011942156B2

(12) United States Patent
Choi et al.

(10) Patent No.: US 11,942,156 B2
(45) Date of Patent: Mar. 26, 2024

(54) MEMORY DEVICE RELATED TO PERFORMING A PROGRAM OPERATION ON MEMORY CELLS

(71) Applicant: SK hynix Inc., Icheon-si (KR)

(72) Inventors: Hyeok Jun Choi, Icheon-si (KR); Hee Sik Park, Icheon-si (KR); Seung Geun Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 118 days.

(21) Appl. No.: 17/671,906

(22) Filed: Feb. 15, 2022

(65) Prior Publication Data

US 2022/0383954 A1   Dec. 1, 2022

(30) Foreign Application Priority Data

Jun. 1, 2021  (KR) .................. 10-2021-0070785
Nov. 30, 2021 (KR) .................. 10-2021-0169310

(51) Int. Cl.
*G11C 16/10*   (2006.01)
*G11C 16/04*   (2006.01)
*G11C 16/08*   (2006.01)
*G11C 16/34*   (2006.01)

(52) U.S. Cl.
CPC .......... *G11C 16/10* (2013.01); *G11C 16/0483* (2013.01); *G11C 16/08* (2013.01); *G11C 16/3459* (2013.01)

(58) Field of Classification Search
CPC ..... G11C 16/10; G11C 16/0483; G11C 16/08; G11C 16/3459; G11C 11/5628; G11C 16/32; G11C 16/34

USPC ..................................................... 365/185.22
See application file for complete search history.

(56) References Cited

U.S. PATENT DOCUMENTS

| 9,343,156 | B1* | 5/2016 | Mui ................. G11C 29/50012 |
| 2015/0092496 | A1* | 4/2015 | Dutta ................ G11C 16/3459 |
| | | | 365/185.19 |
| 2016/0148695 | A1* | 5/2016 | Kim ...................... G11C 29/42 |
| | | | 365/185.12 |
| 2019/0287635 | A1* | 9/2019 | Lee .................... G11C 16/3404 |
| 2022/0293197 | A1* | 9/2022 | Prakash ................ G11C 16/10 |

FOREIGN PATENT DOCUMENTS

| KR | 101903580 B1 | 10/2018 |
| KR | 1020190073943 A | 6/2019 |
| KR | 102007007 B1 | 8/2019 |

* cited by examiner

*Primary Examiner* — Fernando Hidalgo
(74) *Attorney, Agent, or Firm* — William Park & Associates Ltd.

(57) ABSTRACT

Provided herein is a memory device for performing a program operation on memory cells. The memory device include a plurality of memory cells configured to store data, a voltage generator configured to apply program voltages to a word line coupled to the plurality of memory cells during a program operation in which the plurality of memory cells are programmed to a plurality of program states, a cell speed determiner configured to determine a program speed of the plurality of memory cells depending on a number of pulses for the program voltages applied to the word line while the program operation is being performed, and a program manager configured to change a condition for remaining program operations depending on the program speed determined by the cell speed determiner.

16 Claims, 24 Drawing Sheets

C#=REFc

C#<REFc

FIG. 17

| | Vstep | sVpgm | Time |
|---|---|---|---|
| 1fPG | 2-1Vstep | 2-1sVpgm | 2-1T |
| 2fPG (faster than 1fPG) | 2-2Vstep (2-2Vstep < 2-1Vstep) | 2-2sVpgm (2-2sVpgm < 2-1sVpgm) | 2-2T (2-2T < 2-1T) |
| 3fPG (faster than 2fPG) | 2-3Vstep (2-3Vstep < 2-2Vstep) | 2-3sVpgm (2-3sVpgm < 2-2sVpgm) | 2-3T (2-3T < 2-2T) |

FIG. 18

| | Vstep | sVpgm | Time |
|---|---|---|---|
| 1sPG | 3-1Vstep | 3-1sVpgm | 3-1T |
| 2sPG (slower than 1sPG) | 3-2Vstep (3-2Vstep > 3-1Vstep) | 3-2sVpgm (3-2sVpgm > 3-1sVpgm) | 3-2T (3-2T > 3-1T) |
| 3sPG (slower than 2sPG) | 3-3Vstep (3-3Vstep > 3-2Vstep) | 3-3sVpgm (3-3sVpgm > 3-2sVpgm) | 3-3T (3-3T > 3-2T) |

MEMORY DEVICE RELATED TO PERFORMING A PROGRAM OPERATION ON MEMORY CELLS

CROSS-REFERENCE TO RELATED APPLICATION

The present application claims priority under 35 U.S.C. § 119(a) to Korean patent application number 10-2021-0070785, filed on Jun. 1, 2021 and Korean patent application number 10-2021-0169310, filed on Nov. 30, 2021, in the Korean Intellectual Property Office, the entire disclosure of which is incorporated by reference herein.

BACKGROUND

1. Technical Field

Various embodiments of the present disclosure generally relate to a memory device for performing a program operation on memory cells, and more particularly, to a memory device configured to control a program condition depending on the program speed of memory cells.

2. Related Art

A memory system may include a memory device which stores data, and a controller which controls the memory device.

A memory device may include memory blocks in which data is stored, and peripheral circuits which perform a program operation, a read operation or an erase operation. Each memory block may include a plurality of strings coupled between bit lines and a source line, and each of the plurality of strings may include memory cells which can store data. A plurality of memory cells may be programmed, read or erased depending on voltages that are applied to word lines and bit lines.

The memory device may include a memory cell array which stores data, and the memory cell array may include a plurality of memory blocks. Each of the memory blocks may include a plurality of memory cells. Ideally, the electrical characteristics of the plurality of memory cells should be identical to each other, but, realistically, there may occur differences between the electrical characteristics of the plurality of memory cells due to the characteristics of manufacturing processes.

Therefore, during a program operation, the speeds of program operations performed on the plurality of memory cells may differ from each other, thus deteriorating the reliability of the program operation of the memory device.

SUMMARY

An embodiment of the present disclosure may provide for a memory device. The memory device may include a plurality of memory cells configured to store data, a voltage generator configured to apply program voltages to a word line coupled to the plurality of memory cells during a program operation in which the plurality of memory cells are programmed to a plurality of program states, a cell speed determiner configured to determine a program speed of the plurality of memory cells depending on a number of pulses for the program voltages applied to the word line while the program operation is being performed, and a program manager configured to change a condition for remaining program operations depending on the program speed determined by the cell speed determiner.

An embodiment of the present disclosure may provide for a memory device. The memory device may include a plurality of memory cells included in a selected page, a control logic circuit configured to determine a program speed at a time at which memory cells selected from among the plurality of memory cells are programmed to a reference state, among different target program states, while the plurality of memory cells are being programmed to the different target program states, and to change a condition for a program operation based on the determined program speed, and a voltage generator configured to output program voltages so that remaining program operations are performed under control of the control logic circuit.

BRIEF DESCRIPTION OF THE DRAWINGS

FIGS. 17 and 18 are diagrams illustrating a program method according to a seventh embodiment of the present disclosure.

DETAILED DESCRIPTION

Specific structural or functional descriptions in the embodiments of the present disclosure introduced in this specification or application are provided as examples to describe embodiments according to the concepts of the present disclosure. The embodiments according to the concepts of the present disclosure may be practiced in various forms, and should not be construed as being limited to the embodiments described in the specification or application.

Various embodiments of the present disclosure are directed to a memory device that is capable of improving the threshold voltage distribution or the operating time of memory cells during a program operation of the memory device.

Figure 1:
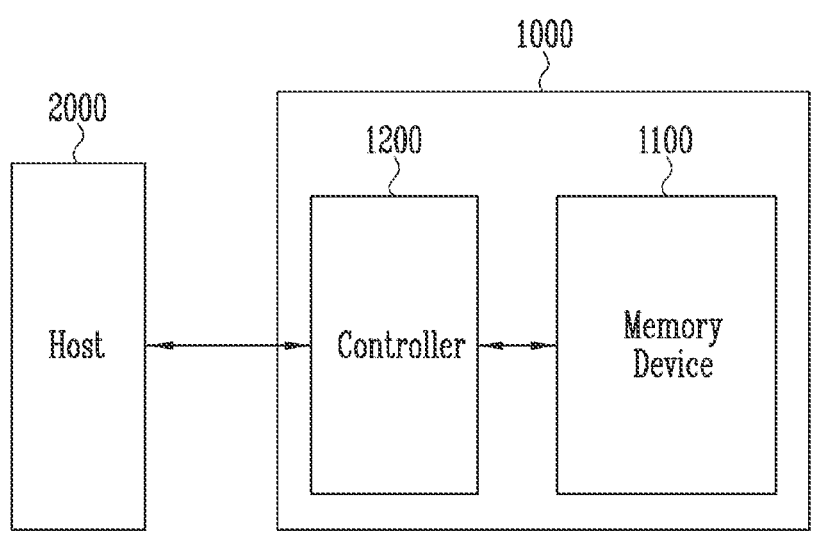
FIG. 1 is a diagram illustrating a memory system according to an embodiment of the present disclosure.

FIG. 1 is a diagram illustrating a memory system according to an embodiment of the present disclosure.

Referring to FIG. 1, a memory system 1000 may store, erase or output data in response to a request from a host 2000. For example, the memory system 1000 may include a memory device 1100 which can store data, and a controller 1200 which can perform communication between the host 2000 and the memory device 1100. Although the memory system 1000 including one memory device 1100 is illustrated in FIG. 1, the memory system 1000 may include two or more memory devices. In the present embodiment, the memory device 1100 may be implemented as a nonvolatile memory device.

The controller 1200 may generate a command for controlling the memory device 1100 in response to a request received from the host 2000, and may map addresses. The controller 1200 may manage logical addresses used by the host 2000 and physical addresses used by the memory device 1100. For example, during a program operation, the controller 1200 may map a logical address used by the host 2000 and a physical address used by the memory device 1100 to each other, and may output a command, the mapped physical address, and data to the memory device 1100.

The memory device 1100 may perform a program operation of storing data in response to the command and the physical address output from the controller 1200. When the command for programming is received from the controller 1200, the memory device 1100 according to the present embodiment may perform a program operation by independently changing a program condition depending on the speed of the memory cells. For example, the memory device 1100 may change the program condition so that, when the program speed of the memory cells is determined to be higher than a reference speed, the program condition is controlled to decrease the program speed, and so that, when the program speed of the memory cells is determined to be lower than the reference speed, the program condition is controlled to increase the program speed. When the program speed of the memory cells is determined to be the reference speed, the memory device 1100 may keep the program condition so that the program speed is maintained.

Figure 2:
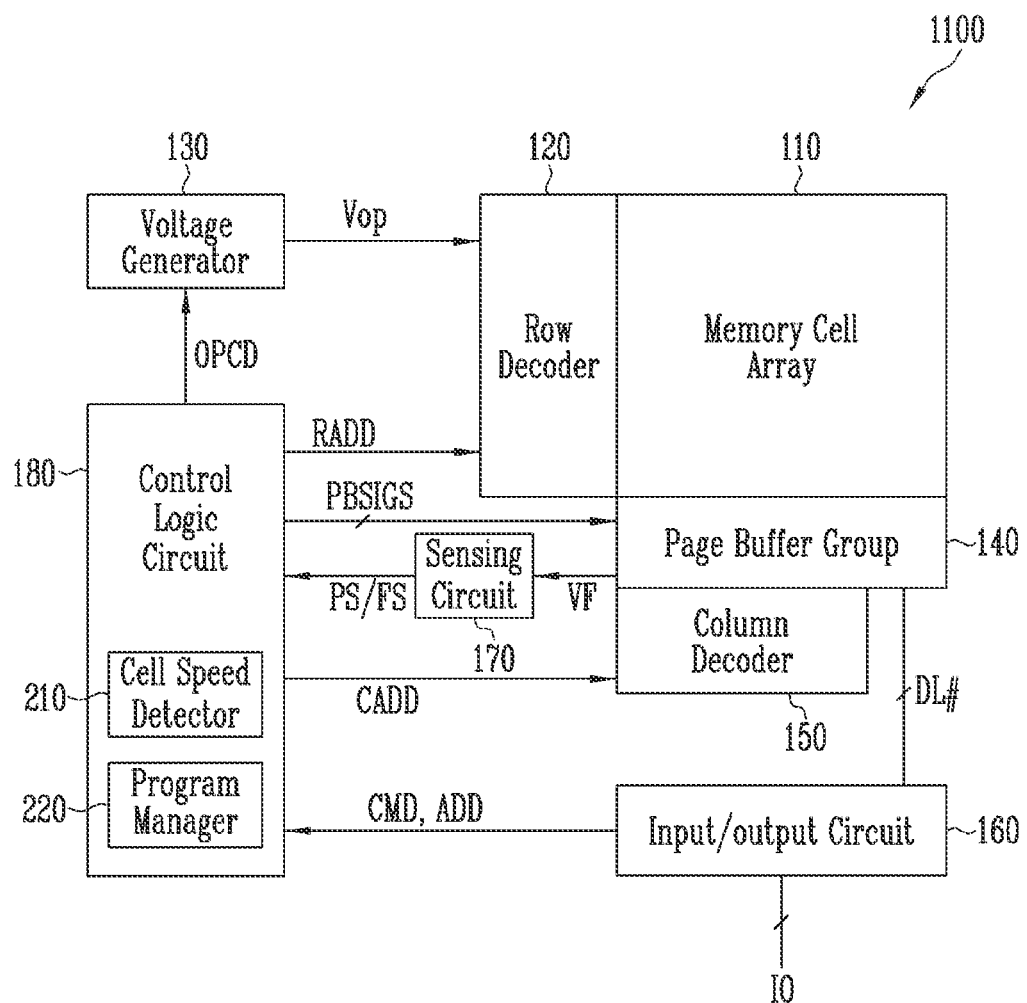
FIG. 2 is a diagram illustrating a memory device according to an embodiment of the present disclosure.

FIG. 2 is a diagram illustrating a memory device according to an embodiment of the present disclosure.

Referring to FIG. 2, the memory device 1100 may include a memory cell array 110 in which data is stored, and peripheral circuits 120 to 180 which can perform a program operation, a read operation or an erase operation.

The memory cell array 110 may include a plurality of memory blocks in which data is stored. Each of the memory blocks may include a plurality of memory cells, which may be implemented in a two-dimensional (2D) structure in which memory cells are horizontally arranged on a substrate or in a three-dimensional (3D) structure in which memory cells are vertically stacked on a substrate.

The peripheral circuits 120 to 180 may include a row decoder 120, a voltage generator 130, a page buffer group 140, a column decoder 150, an input/output circuit 160, a sensing circuit 170, and a control logic circuit 180.

The row decoder 120 may select one memory block from among the memory blocks included in the memory cell array 110 in response to a row address RADD, and may transmit operating voltages Vop to the selected memory block.

The voltage generator 130 may generate and output the operating voltages Vop required for various operations in response to an operation code OPCD. For example, the voltage generator 130 may generate a start program voltage, a program voltage, a read voltage, an erase voltage, a pass voltage, a verify voltage, a negative voltage, etc. in response to the operation code OPCD, and may selectively output the generated voltages. Further, the voltage generator 130 may set a step voltage, and may gradually increase the program voltage by the step voltage during a program operation. The step voltage may be a voltage corresponding to a voltage difference between a previous program voltage and a next program voltage when the program voltage is gradually increased to increase threshold voltages of memory cells. Further, the voltage generator 130 may set a minus offset voltage or a plus offset voltage for the corresponding program voltage, and may change the level of the program voltage depending on the set offset voltage.

The voltage generator 130 may change the level of the start program voltage, the level of the step voltage or a program voltage active time in response to the operation code OPCD. Here, the program voltage active time may be the time during which the program voltage is applied to a selected word line.

The page buffer group 140 may be coupled to the memory cell array 110 through bit lines. For example, the page buffer group 140 may include page buffers coupled to respective bit lines. The page buffers may be simultaneously operated in response to page buffer control signals PBSIGS, and may temporarily store data during a program or read operation. During a verify operation performed in the program operation, the page buffers may read the voltages or currents of bit lines, varying with the threshold voltages of memory cells, and may temporarily store the read voltages or currents as verification data VF. The page buffers may transmit the temporarily stored verification data VF to the sensing circuit 170.

The column decoder 150 may transmit data through data lines DL, which couple the input/output circuit 160 and the page buffer group 140 to each other, in response to a column address CADD.

The input/output circuit 160 may be coupled to a controller (e.g., 1200 of FIG. 1) through input/output lines IO. The input/output circuit 160 may receive/output a command CMD, an address ADD, and data through the input/output lines IO. For example, the input/output circuit 160 may transmit the command CMD and the address ADD, received from the controller 1200 through the input/output lines IO, to the control logic circuit 180, and may transmit the data, received from the controller 1200 through the input/output lines IO, to the page buffer group 140. The input/output circuit 160 may output the data, received from the page buffer group 140, to the controller 1200 through the input/output lines IO.

The sensing circuit 170 may output a pass signal PS when the number of fail bits included in the verification data VF is less than or equal to the allowable number of fail bits, and may output a fail signal FS when the number of fail bits is greater than the allowable number of fail bits.

The control logic circuit 180 may output the operation code OPCD, the row address RADD, the page buffer control signals PBSIGS, and the column address CADD in response to the command CMD and the address ADD. For example, the control logic circuit 180 may include software which executes an algorithm in response to the command CMD, and hardware which outputs various signals depending on the address ADD and the algorithm. The control logic circuit 180 may determine, based on the pass signal PS or the fail signal FS output from the sensing circuit 170, whether programming of selected memory cells or a selected page has been completed during a program operation, and may determine the program speed of the selected memory cells or the selected page depending on the number of pulses (i.e., a pulse count) when the program operation is completed. Also, the control logic circuit 180 may control a condition for a next program operation based on the pulse count. For this, the control logic circuit 180 may include a cell speed detector 210 and a program manager 220.

The cell speed detector 210 may count the number of program voltages used or the number of program loops performed in the program operation that is performed on the selected memory cells or the selected page in response to the fail signal FS. The cell speed detector 210 may compare a final pulse count with a reference pulse count in response to the pass signal PS, and may output a determination result based on the result of the comparison. For example, the determination result may include information about 'normal (normal program speed)', 'fast (fast program speed)', or 'slow (slow program speed)'. For example, the cell speed detector 210 may store a reference pulse count corresponding to the reference speed. The cell speed detector 210 may compare the pulse count with the reference pulse count, and may then output the determination result. The determination result may include 'normal', 'fast' or 'slow' information about the selected memory cells or the selected page.

The program manager 220 may generate an operation code OPCD based on the determination result output from the cell speed detector 210, and may output the operation code OPCD for a next program operation. For example, the program manager 220 may generate and output the operation code OPCD required in order to change the level of the start program voltage, the level of the step voltage or the program voltage active time based on the determination result output from the cell speed detector 210. That is, the program manager 220 may generate and output the operation code OPCD required in order to change a condition corresponding to at least one selected from among the level of the start program voltage, the level of the step voltage, and the program voltage active time.

Figure 3:
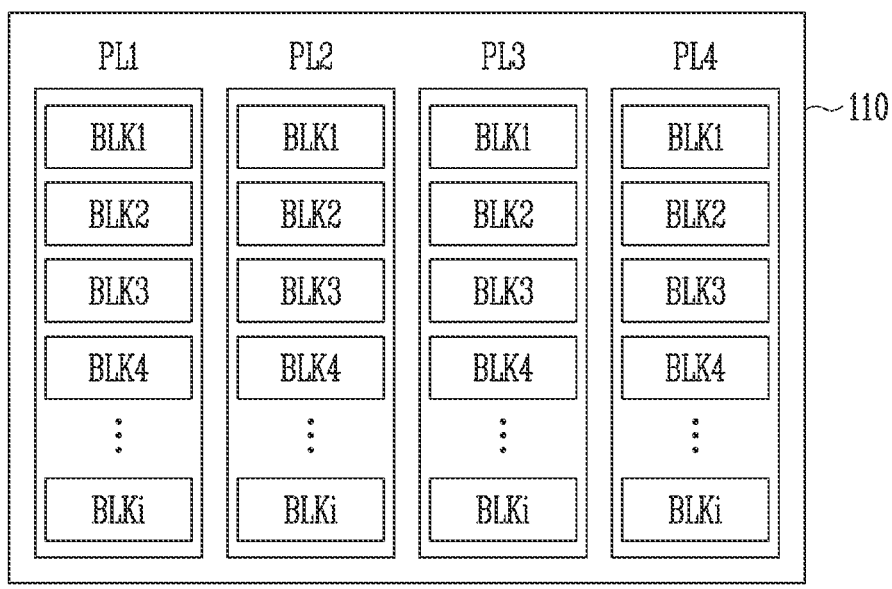
FIG. 3 is a diagram illustrating a memory cell array.

FIG. 3 is a diagram illustrating a memory cell array.

Referring to FIG. 3, the memory cell array 110 may be implemented as a single-plane structure or a multi-plane structure. The single-plane structure denotes a configuration in which only one plane is included in the memory cell array 110, and the multi-plane structure denotes a configuration in which multiple planes are included in the memory cell array 110. In FIG. 3, the memory cell array 110 having a multi-plane structure is illustrated. For example, the memory cell array 110 may include first to fourth planes PL1 to PL4. The first to fourth planes PL1 to PL4 may be defined as memory areas to which different row decoders and different page buffer groups are coupled. Each of the first to fourth planes PL1 to PL4 may include first to i-th memory blocks BLK1 to BLKi (where i is a positive integer). The first to i-th memory blocks BLK1 to BLKi included in different planes may be coupled to different row decoders and different page buffer groups, and the first to i-th memory blocks BLK1 to BLKi included in the same plane may be coupled to the same row decoder and the same page buffer group. The first to i-th memory blocks BLK1 to BLKi may be configured in the same structure.

Figure 4:
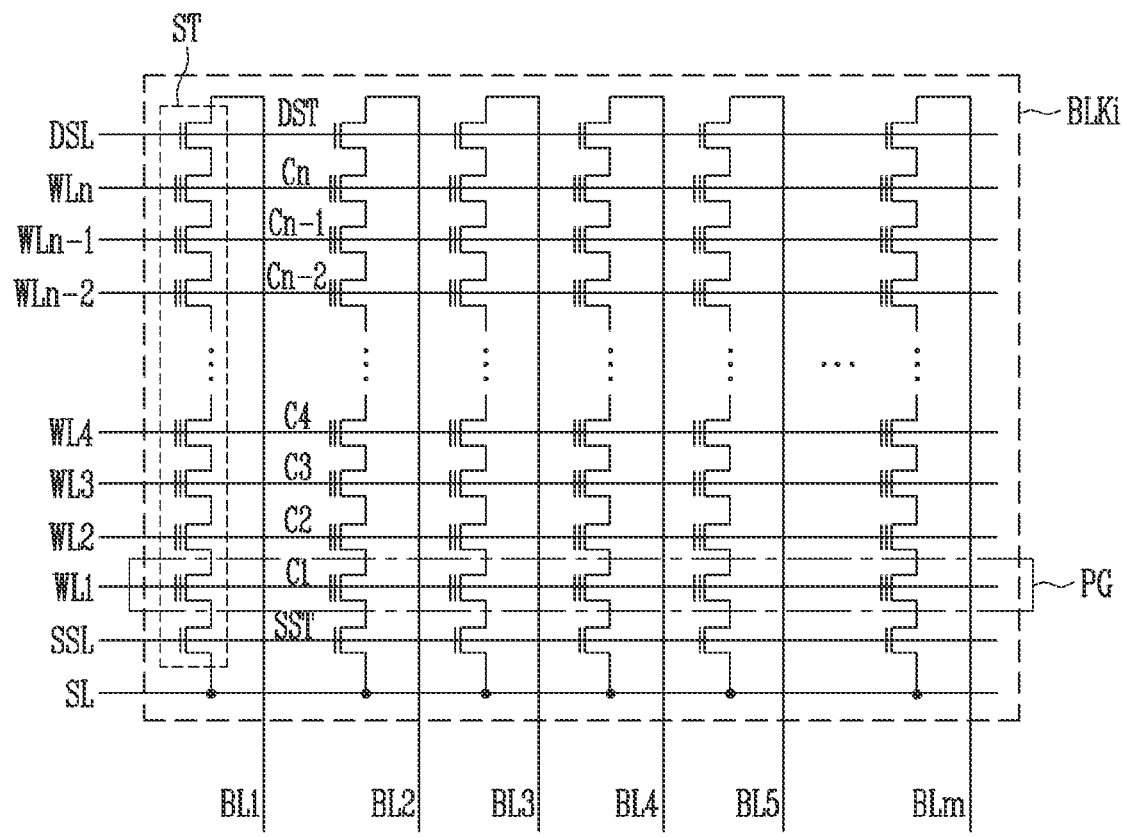
FIG. 4 is a diagram illustrating a memory block.

FIG. 4 is a diagram illustrating a memory block.

Referring to FIG. 4, any one memory block BLKi, among the plurality of memory blocks BLK1 to BLKi illustrated in FIG. 3, is illustrated by way of example.

The memory block BLKi may include a plurality of strings ST coupled between first to m-th bit lines BL1 to BLm (where m is a positive integer) and a source line SL. Each of the strings ST may include a source select transistor SST, first to n-th memory cells C1 to Cn, and a drain select transistor DST which are coupled in series between the source line SL and a corresponding one of the first to m-th bit lines BL1 to BLm.

Since the memory block BLKi illustrated in FIG. 4 is intended to explain the configuration of the memory block, the numbers of source select transistors SST, first to n-th memory cells C1 to Cn, and drain select transistors DST are not limited to those illustrated in FIG. 4.

Respective gates of source select transistors SST coupled to different strings ST may be coupled to a source select line SSL, respective gates of the first to n-th memory cells C1 to Cn may be coupled to first to n-th word lines WL1 to WLn, and respective gates of the drain select transistors DST may be coupled to a drain select line DSL.

A group of memory cells coupled to the same word line and included in different strings ST may form one page (PG). A program operation may be performed on a page (PG) basis.

The memory cells included in the memory block BLKi may be variously programmed depending on a program scheme. For example, the program operation may be performed in a single-level cell (SLC), multi-level cell (MLC), triple-level cell (TLC) or quadruple-level cell (QLC) scheme. The SLC scheme may be a scheme for storing 1 bit of data in one memory cell. The MLC scheme may be a scheme for storing 2 bits of data in one memory cell. The TLC scheme may be a scheme for storing 3 bits of data in one memory cell. The QLC scheme may be a scheme for storing 4 bits of data in one memory cell. In addition, 5 or more bits of data may be stored in one memory cell. Threshold voltage distributions of memory cells programmed using the TLC scheme, among the schemes, are described below by way of example.

Figure 5:
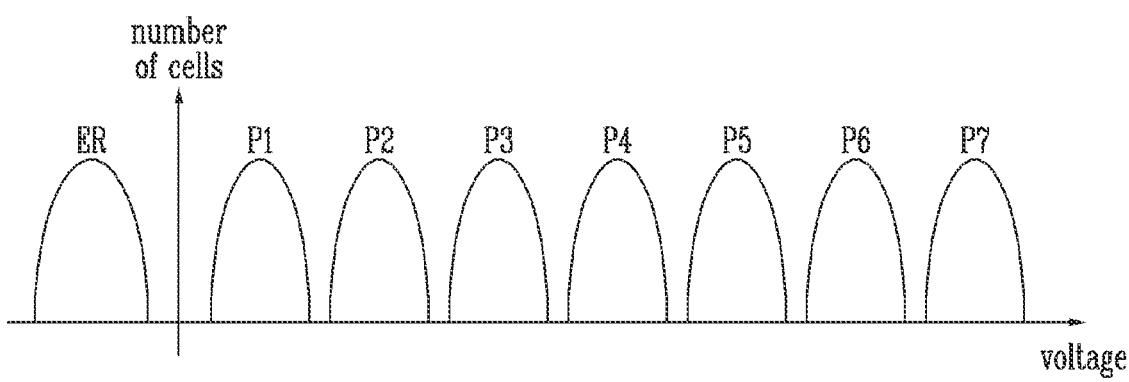
FIG. 5 is a diagram illustrating threshold voltage distributions of memory cells.

FIG. 5 is a diagram illustrating threshold voltage distributions of memory cells.

Referring to FIG. 5, in a program operation using a TLC scheme, the states of memory cells may be divided into an erased state ER and first to seventh program states P1 to P7 according to the threshold voltage. In the program operation according to the present embodiment, any one program state selected from among the first to seventh program states P1 to P7 may be set as a reference state, and a condition for a subsequent program operation may be controlled depending on the speed of memory cells programmed to the reference state. For example, the reference state may be set to any one of the first to seventh program states P1 to P7, but it is preferable to set the reference state among the program states except the lowest state and the highest state. The reason for this is that, in the first program state P1 having the lowest threshold voltage, it may be difficult to clearly distinguish a fast cell from a slow cell, and that the seventh program state P7 having the highest threshold voltage indicates an interval in which a program operation on the selected page is terminated. Therefore, in the present embodiment, it is preferable to select, as the reference state, an intermediate program state from among the first to seventh program states P1 to P7, or one of the remaining program states, other than the first program state P1 that is the lowest program state, from among program states lower than the intermediate program state. For example, the third program state P3 may be set as the reference state. In this case, program operations corresponding to the first to third program states P1 to P3 may be performed based on an initial program condition, and program operations corresponding to the fourth to seventh program states P4 to P7 may be performed based on the changed program condition.

The program speed of the above-described memory cells will be described below.

Figure 6:
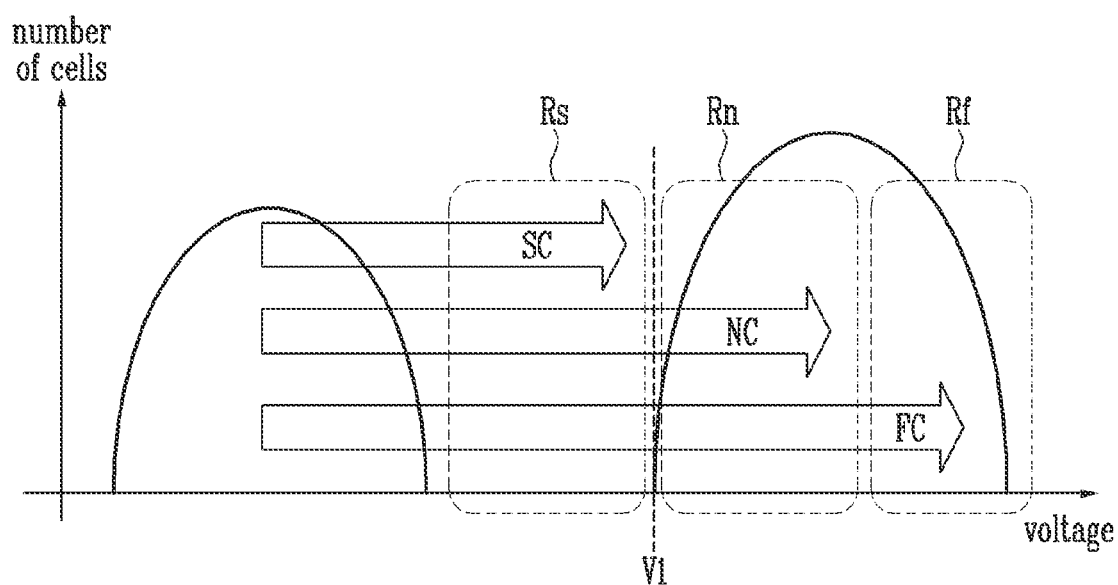
FIG. 6 is a diagram illustrating threshold voltages of memory cells depending on program speeds.

FIG. 6 is a diagram illustrating threshold voltages of memory cells depending on program speeds.

Referring to FIG. 6, the threshold voltages of memory cells may be increased to different levels through the same program voltage depending on the electrical characteristics of the memory cells. For example, when the program voltage having the same level is applied to gates of memory cells having different program speeds during the same time, threshold voltages of slow cells SC may be increased to a first region Rs, the threshold voltages of normal cells NC may be increased to a second region Rn higher than the first region Rs, and the threshold voltages of fast cells FC may be increased to a third region Rf higher than the second region Rn.

Assuming that a first voltage V1 is a target voltage, memory cells having different program speeds may be determined depending on the number of program voltages that are used or the number of loops that are performed until the threshold voltages of the memory cells reach the first voltage V1. For example, in order for the threshold voltages of the slow cells SC to increase to the first voltage V1, a number of program voltages greater than the number of program voltages used to complete a program operation on the normal cells NC may be required. For the fast cells FC, a number of program voltages less than the number of program voltages used to complete the program operation on the normal cells NC may be used.

In the present embodiment, the speeds of memory cells may be determined depending on the number of program voltages used until the program operation on the memory cells is completed.

Figure 7:
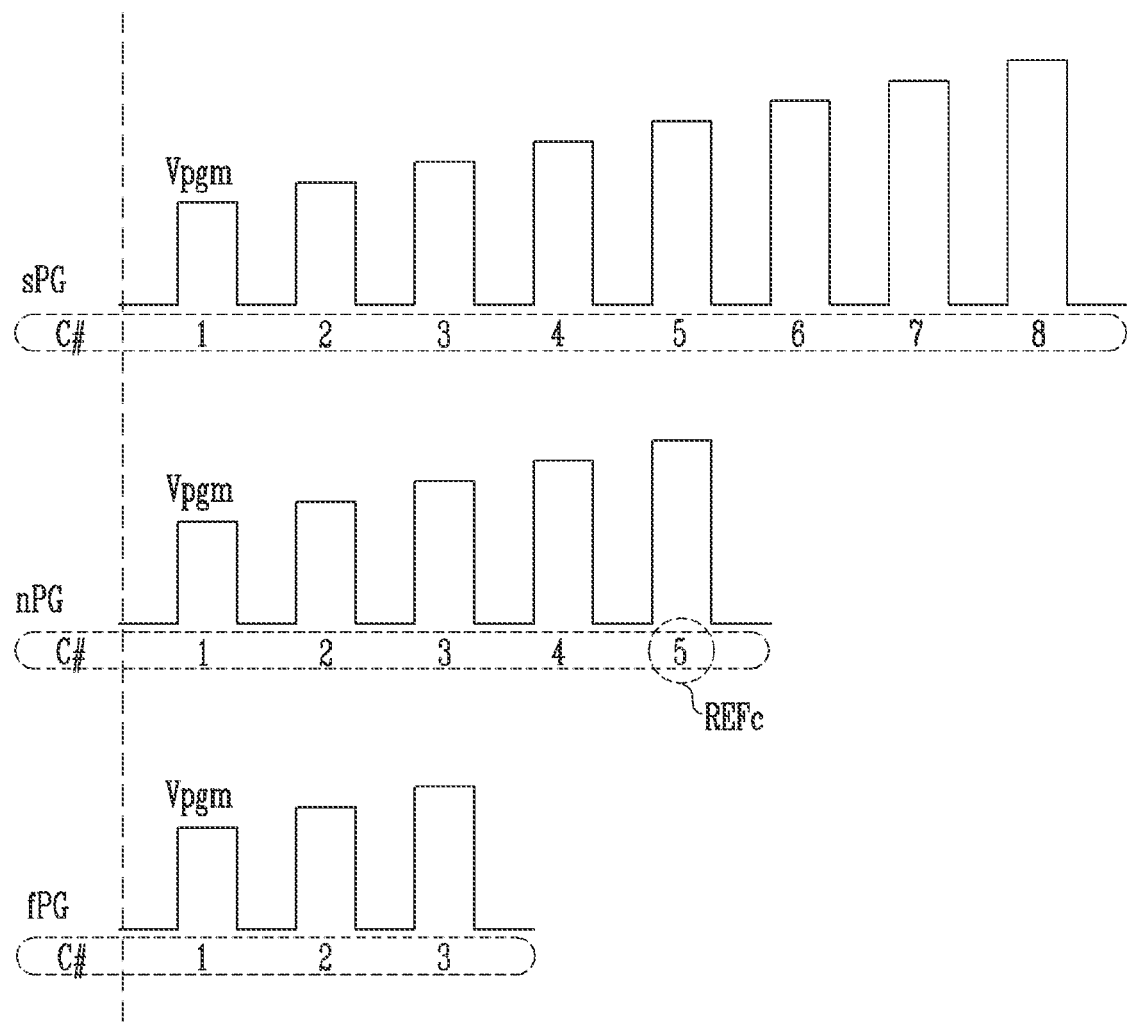
FIG. 7 is a diagram illustrating program loops depending on the program speeds of memory cells.

FIG. 7 is a diagram illustrating program loops depending on the program speeds of memory cells.

Referring to FIG. 7, the number of program voltages Vpgm used until memory cells selected from among memory cells included in a normal page nPG are programmed to a reference state is defined as a reference pulse count REFc. That is, in the present embodiment, the number of program voltages Vpgm used to program the selected memory cells to the reference state is defined as a pulse count C#, and the pulse count C# of the normal page nPG is defined as a reference pulse count REFc. Alternatively, the pulse count C# may be the number of program loops performed until the selected memory cells are programmed to the reference state. Although not illustrated in the drawing, a verify operation using a verify voltage may be performed after a program period using the program voltage Vpgm.

Assuming that the number of pulses (i.e., a pulse count) C# for program voltages, used while selected memory cells in the normal page nPG are being programmed to the reference state, is 5, the reference number of pulses (i.e., a reference pulse count) REFc is 5. Because the program operation performed on the slow page sPG takes a longer time than that of the normal page nPG, the pulse count C# thereof may be greater than 5. Because the program operation performed on the fast page fPG takes a shorter time than that of the normal page nPG, the pulse count C# thereof may be less than 5.

In the present embodiment, the slow page sPG, the normal page nPG, and the fast page fPG may be identified based on the above-described pulse count C#, and the condition for the program operation may be controlled depending on the program speeds of respective pages.

Figure 8:
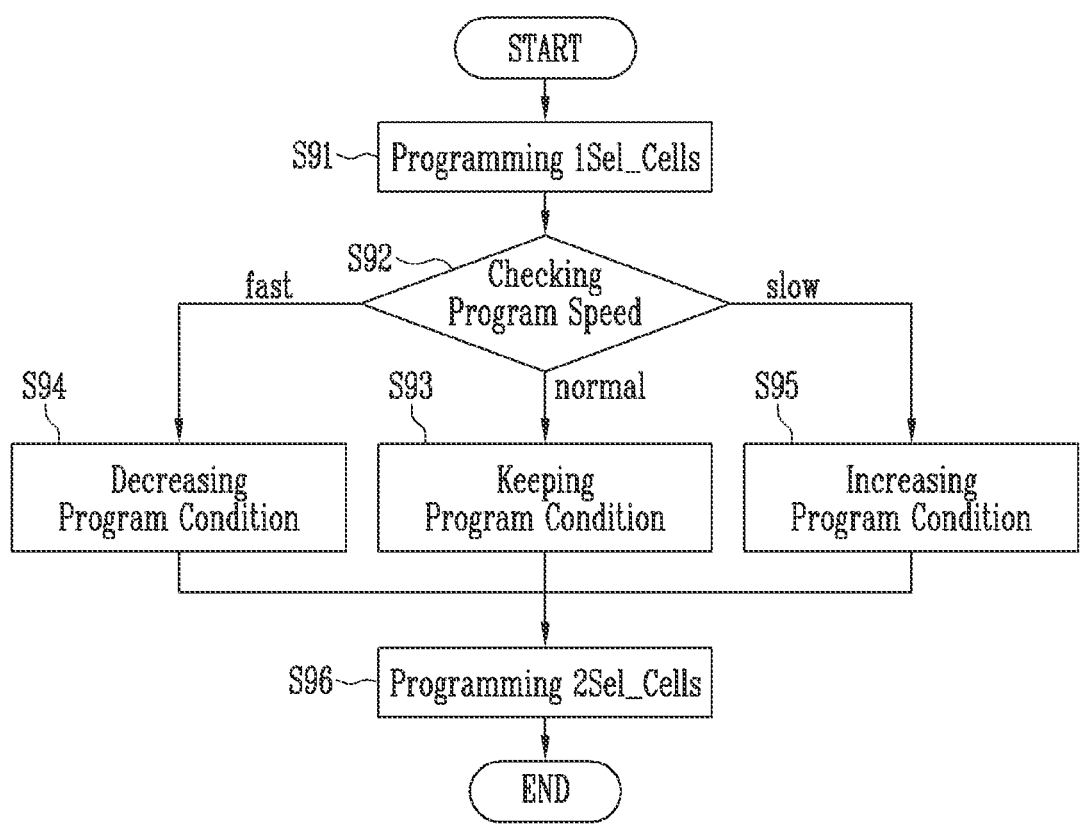
FIG. 8 is a flowchart illustrating a program method according to an embodiment of the present disclosure.

FIG. 8 is a flowchart illustrating a program method according to an embodiment of the present disclosure.

Referring to FIG. 8, a program operation according to the present embodiment may be configured such that a program condition for second selected memory cells 2Sel_Cells is controlled depending on a pulse count for program voltages used in a program operation performed on first selected memory cells 1Ssel_Cells, and a program operation on the second selected memory cells 2Sel_Cells may be performed based on the controlled program condition. The program operation according to the present embodiment will be described below.

A program operation may be performed on first selected memory cells 1Sel_Cells at step S91. The program operation on the first selected memory cells 1Sel_Cells may be performed based on an initial program condition set in the memory device. At step S91, the program operation may be performed in an incremental step pulse programming (ISPP) manner in which a program voltage is gradually increased. At step S91, when threshold voltages of all of the first selected memory cells 1Sel_Cells are increased to a target voltage, step S92 may be performed.

At step S92, the program speeds of the first selected memory cells 1Sel_Cells may be checked. For example, the program speeds of the first selected memory cells 1Sel_Cells may be determined depending on the pulse count for the first selected memory cells 1Sel_Cells. For example, when the pulse count for the program voltages, used while the threshold voltages of all of the first selected memory cells 1Sel_Cells are increased to the target voltage, is equal to the reference pulse count, the control logic circuit (e.g., 180 of FIG. 2) may determine that the first selected memory cells 1Sel_Cells are normal cells. Further, when the pulse count is less than the reference pulse count, the control logic circuit 180 may determine that the first selected memory cells 1Sel_Cells are fast cells, whereas when the pulse count is greater than the reference pulse count, the control logic circuit 180 may determine that the first selected memory cells 1Sel_Cells are slow cells.

As a result of checking at step S92, when the first selected memory cells 1Sel_Cells are determined to be normal cells, the control logic circuit 180 may keep the program condition at the same program condition as a previous operation at step S93. For example, the control logic circuit 180 may keep the initial program condition set in the previous operation.

When the first selected memory cells 1Sel_Cells are determined to be fast cells as a result of the checking at step S92, the control logic circuit 180 may decrease the program condition to reduce the program speed from the previous program speed at step S94. For example, the control logic circuit 180 may lower the level of the program voltage, lower the level of the step voltage, decrease the program voltage active time, or apply a minus offset to each program voltage, which is included in the initial program condition set in the previous operation.

When the first selected memory cells 1Sel_Cells are determined to be slow cells as a result of the checking at step S92, the control logic circuit 180 may increase the program condition to raise the program speed from the previous program speed at step S95. For example, the control logic circuit 180 may raise the level of the program voltage, raise the level of the step voltage, increase the program voltage active time, or apply a plus offset to each program voltage, which is included in the initial program condition set in the previous operation. Then, the program operation may be performed on the second selected memory cells 2Sel_Cells based on the condition, set at any one of steps S93 to S95, at step S96.

The first and second selected memory cells 1Sel_Cells and 2Sel_Cells may be changed depending on the program operation. For example, the program operation may be performed using a scheme in which threshold voltages of memory cells in an erased state are increased sequentially or non-sequentially.

Figure 9A:
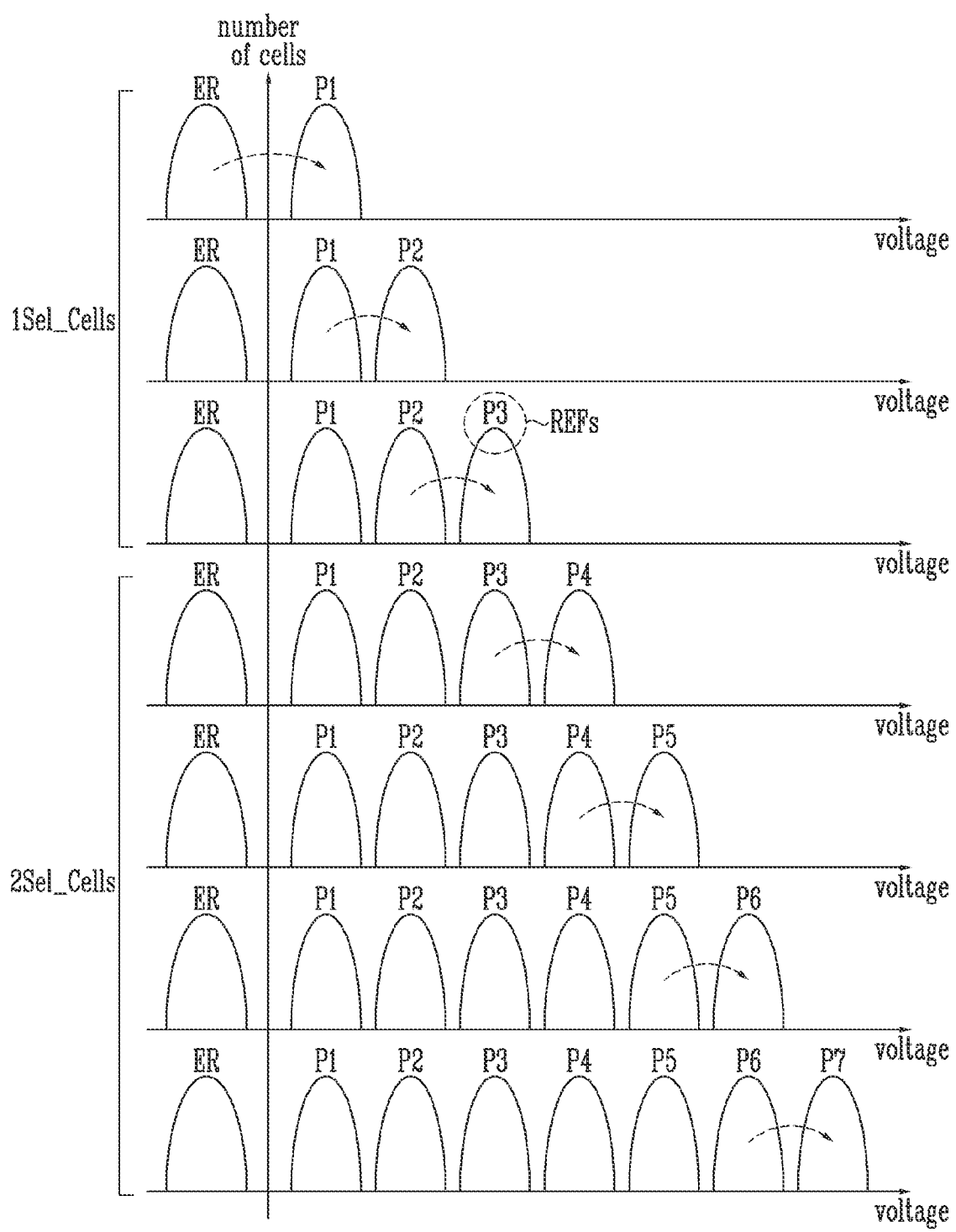
FIGS. 9A and 9B are diagrams illustrating various program operations.
Figure 9B:
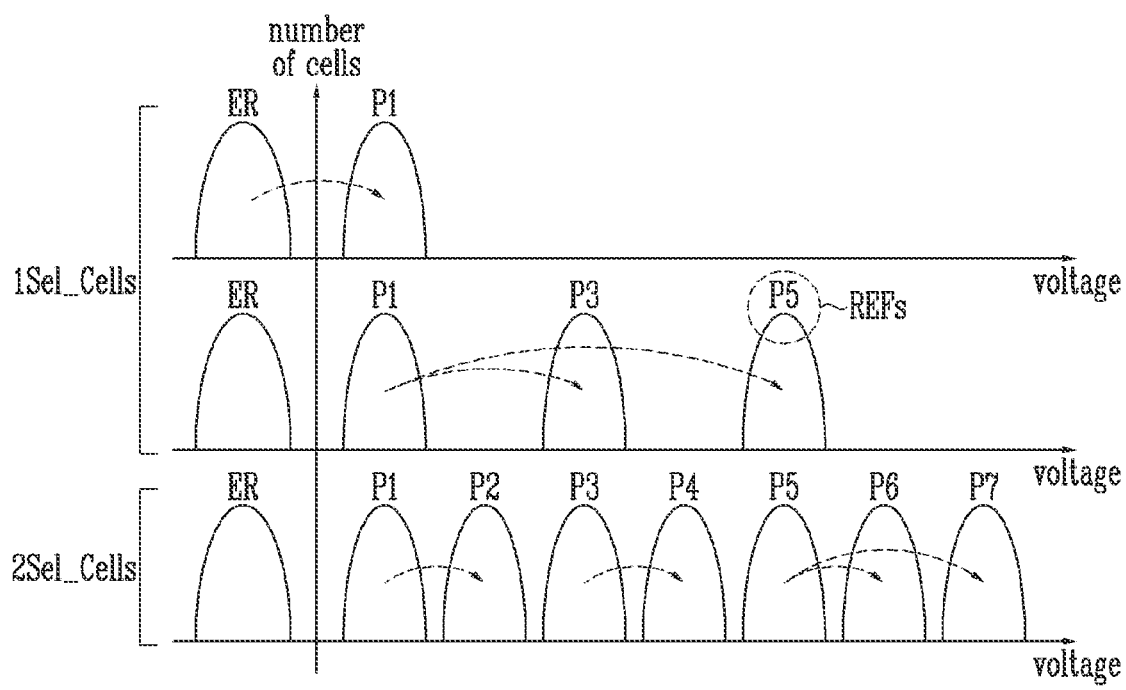

FIGS. 9A and 9B are diagrams illustrating various program operations.

Referring to FIG. 9A, a program operation may be performed using a scheme in which threshold voltages of memory cells are sequentially increased. A program operation performed using a triple-level cell (TLC) scheme in which 3 bits of data are stored in one memory cell is described below by way of example.

The program operation of FIG. 9A may be performed using a scheme in which memory cells in an erased state ER are sequentially programmed to first to seventh program states P1 to P7. In this scheme, the threshold voltages of the memory cells are sequentially increased, and thus first and second selected memory cells 1Sel_Cells and 2Sel_Cells may be sequentially selected depending on the target program state. For example, the first selected memory cells 1Sel_Cells may be set to memory sells having first to third program states P[M]1 to P3 as target program states, and the second selected memory cells 2Sel_Cells may be set to memory cells having the remaining program states, i.e., fourth to seventh program states P4 to P7 as target program states. In the embodiment illustrated in FIG. 9A, the third program state P3 is set to a reference state REFs based on which the first and second selected memory cells 1Sel_Cells and 2Sel_Cells are distinguished from each other, but the reference state REFs based on which the first and second selected memory cells 1Sel_Cells and 2Sel_Cells are distinguished from each other may be set to any one of the program states between the first and seventh program states P1 and P7 in addition to the third program state P3. When the program operation for the first to third program states P1 to P3 is performed, the condition for program operations for the remaining fourth to seventh program states P4 to P7 may be maintained or changed depending on the program speed of the memory cells programmed to the first to third program states P1 to P3.

Referring to FIG. 9B, a program operation may be performed using a scheme in which threshold voltages of memory cells are non-sequentially increased. For example, among memory cells in an erased state ER, memory cells having first to seventh program states P1 to P7 as target program states may be programmed to the first program state PRIM. Then, some of the memory cells programmed to the first program state P1 may be programmed to the third or fifth program state P3 or P5. That is, some of the memory cells programmed to the first program state P1 may be programmed to the third program state P3, and others may be programmed to the fifth program state P5. When the memory cells having first, third, and fifth program states P1, P3, and P5 as the target program states are set as the first selected memory cells 1Sel_Cells, and the memory cells having second, fourth, sixth, and seventh program states P2, P4, P6, and P7 as the target program states may be set as the second selected memory cells 2Sel_Cells. Therefore, when the program operations for the first, third, and fifth program states P1, P3, and P5 are performed, the condition for program operations for the remaining program states, that is, second, fourth, sixth, and seventh program states P2, P4, P6 and P7 may be maintained or changed depending on the program speed of the first selected memory cells 1Sel_Cells programmed to the first, third, and fifth program states P1, P3, and P5.

Figure 10:
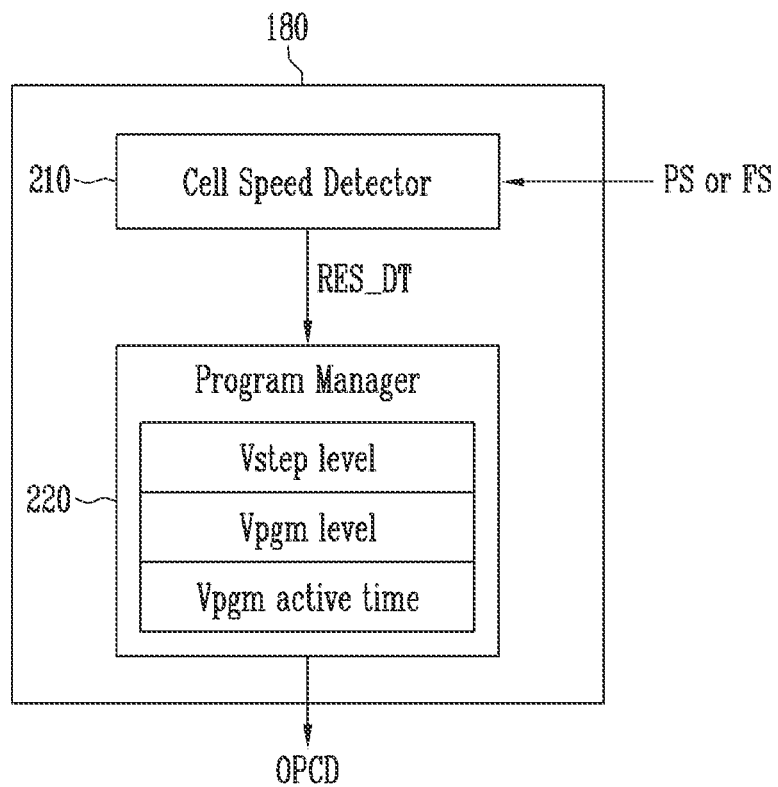
FIG. 10 is a diagram illustrating a control logic circuit according to an embodiment of the present disclosure.

FIG. 10 is a diagram illustrating a control logic circuit according to an embodiment of the present disclosure.

Referring to FIG. 10, the control logic circuit 180 may include a cell speed detector 210 and a program manager 220.

The cell speed detector 210 may store a reference pulse count, and may increase a pulse count by 1 depending on a fail signal FS. The cell speed detector 210 may compare a pulse count, obtained when a pass signal PS is input, with the reference pulse count, and may determine the speed of the memory cells based on the result of the comparison. For example, the cell speed detector 210 may output a determination result RES_DT including 'fast' information when the finally determined pulse count is less than the reference pulse count. The cell speed detector 210 may output a determination result RES_DT including 'normal' information when the finally determined pulse count is equal to the reference pulse count. The cell speed detector 210 may output a determination result RES_DT including 'slow' information when the finally determined pulse count is greater than the reference pulse count.

The program manager 220 may change a condition for a next program operation based on the determination result RES_DT output from the cell speed detector 210, and may output an operation code OPCD to which the changed condition is applied. For example, the program manager 220 may generate and output the operation code OPCD required to change at least one condition selected from among the level of a step voltage Vstep, the level of a program voltage Vpgm, and a program voltage active time (Vpgm active time) based on the determination result RES_DT. For example, when the determination result RES_DT indicates 'normal', the program manager 220 may generate and output the operation code OPCD so that the level of the step voltage Vstep, the level of the program voltage Vpgm, and the program voltage active time (Vpgm active time) are maintained at initial set values. When the determination result RES_DT indicates 'fast', the program manager 220 may change and output the operation code OPCD so that the level of the step voltage Vstep, the level of the program voltage Vpgm, and the program voltage active time (Vpgm active time) are decreased from the initial set values. When the determination result RES_DT indicates 'slow', the program manager 220 may change and output the operation code OPCD so that the level of the step voltage Vstep, the level of the program voltage Vpgm, and the program voltage active time (Vpgm active time) are increased from the initial set values.

Figure 11A:
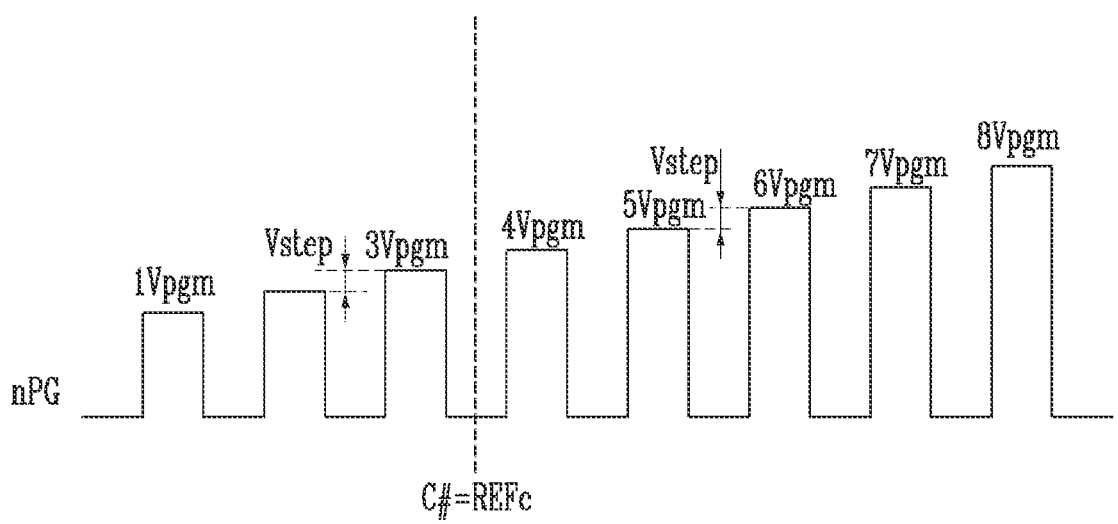
FIGS. 11A, 11B, and 11C are diagrams illustrating a program method according to a first embodiment of the present disclosure.
Figure 11B:
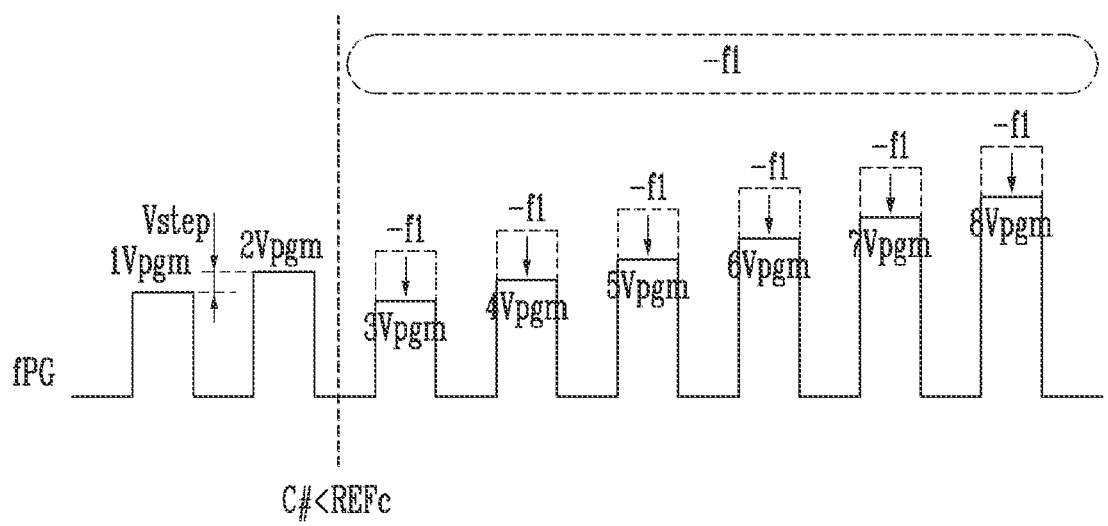
Figure 11C:
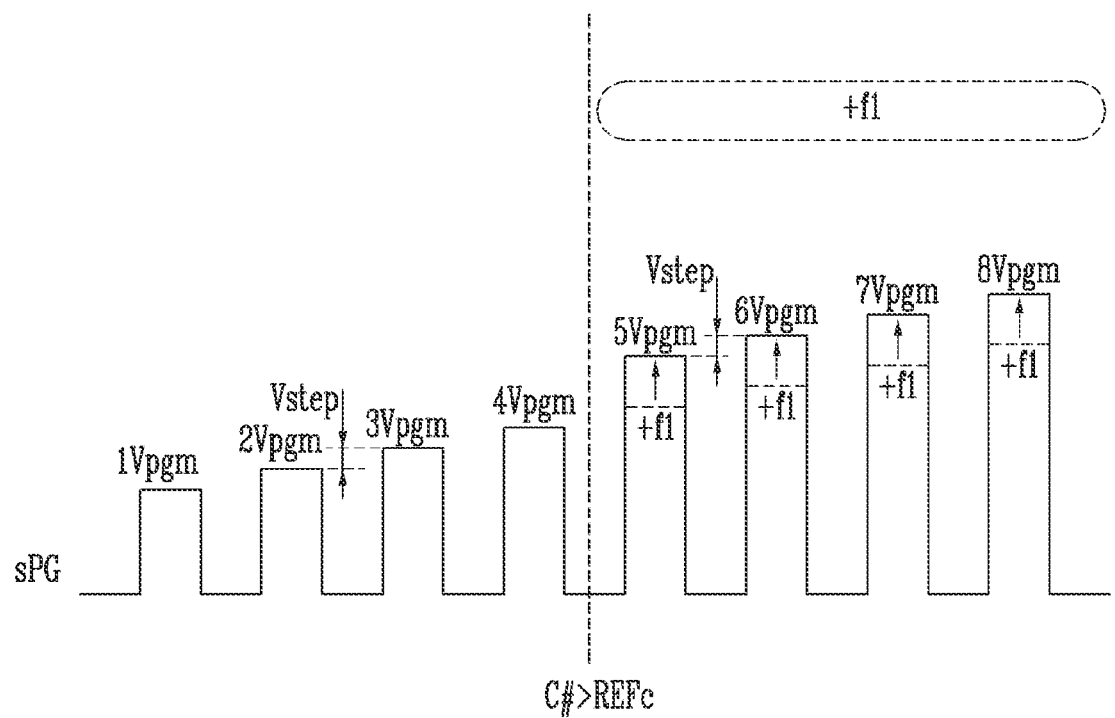

FIGS. 11A to 11C are diagrams illustrating a program method according to a first embodiment of the present disclosure.

Referring to FIG. 11A, when a program operation performed on the selected memory cells to be programmed to a reference state is completed at a program operation using a third program voltage 3Vpgm, the memory device may determine the program speed by comparing a pulse count C# for program voltages used in the program operation on the selected memory cells with a reference pulse count REFc. Here, the third program voltage 3Vpgm is an example provided for better understanding of the present disclosure, and may be changed depending on the reference state, selected from among all program states, and the program speed of the memory cells.

For example, it is assumed that each of the first to third program voltages 1Vpgm to 3Vpgm is gradually increased by a step voltage Vstep. When the pulse count C# for the program voltages, used in the program operation while the memory cells are being programmed to the reference state, is equal to the reference pulse count REFc (C#=REFc), the control logic circuit (e.g., 180 of FIG. 10) may determine that the selected page is a normal page nPG. In this case, the control logic circuit 180 may maintain the condition for the remaining program operations at the same condition as the previous program operation. For example, the control logic circuit 180 may keep the same program condition as the initial program condition so that each of fourth to eighth program voltages 4Vpgm to 8Vpgm to be used subsequent to the third program voltage 3Vpgm is gradually increased by the step voltage Vstep.

Referring to FIG. 11B, in the case where the second program voltage 2Vpgm is used when selected memory cells are programmed to the reference state, the control logic circuit (e.g., 180 of FIG. 10) may determine that the selected page is a fast page fPG because a pulse count C# is less than a reference pulse count REFc (C#<REFc). In this case, the control logic circuit 180 may apply a first minus offset of −f1 to the program operations for the remaining program states. That is, the program voltage may be decreased by applying the first minus offset of −f1 to the third to eighth program voltages 3Vpgm to 8Vpgm to be used in the remaining program operations, and thus the program operation speed of fast cells may be decreased. The level of the first minus offset of −f1 may change depending on the pulse count C#. For example, as the difference between the pulse count C# and the reference pulse count REFc increases, the level of the first minus offset of −f1 may also increase.

Referring to FIG. 11C, in the case where the fourth program voltage 4Vpgm is used when selected memory cells are programmed to the reference state, the control logic circuit (e.g., 180 of FIG. 10) may determine that the selected page is a slow page sPG because a pulse count C# is greater than a reference pulse count REFc (C#>REFc). In this case, the control logic circuit 180 may apply a first plus offset of +f1 to the program operations for the remaining program states. That is, the program voltage may be increased by applying the first plus offset of +f1 to the fifth to eighth program voltages 5Vpgm to 8Vpgm to be used in the remaining program operations, and thus the program operation speed of slow cells may be increased. The level of the first plus offset of +f1 may change depending on the pulse count C#. For example, as the difference between the pulse count C# and the reference pulse count REFc increases, the level of the first plus offset of +f1 may also increase.

Figure 12A:
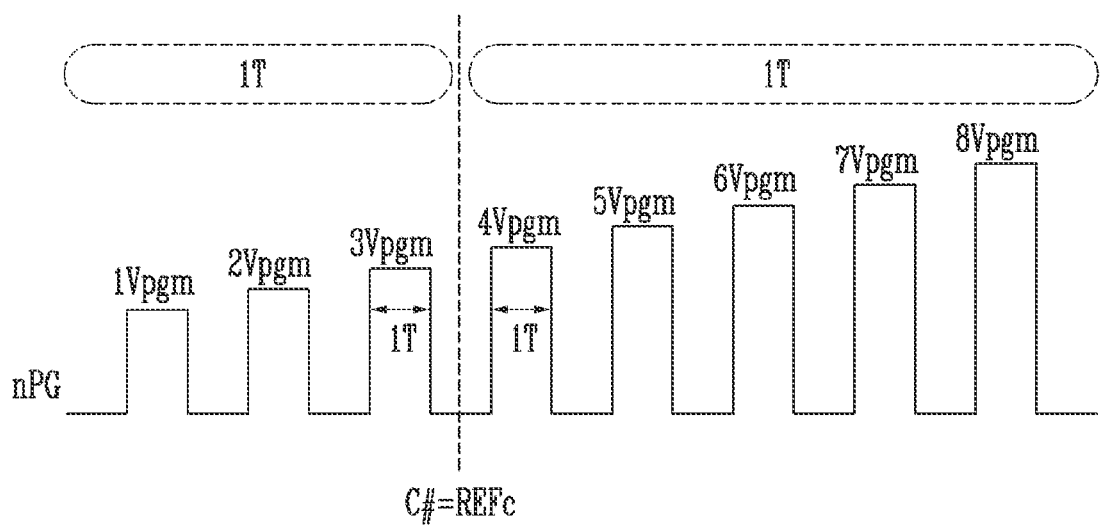
FIGS. 12A, 12B, and 12C are diagrams illustrating a program method according to a second embodiment of the present disclosure.
Figure 12B:
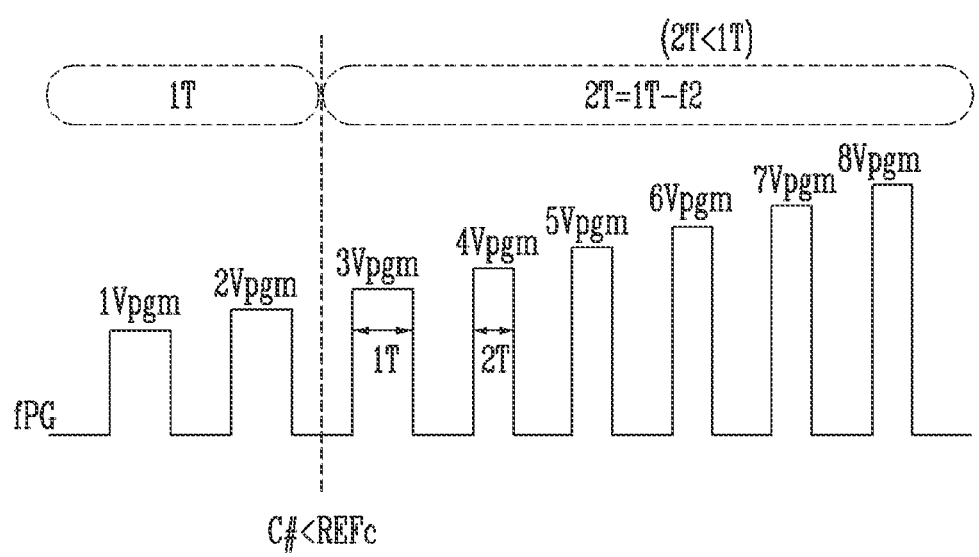
Figure 12C:
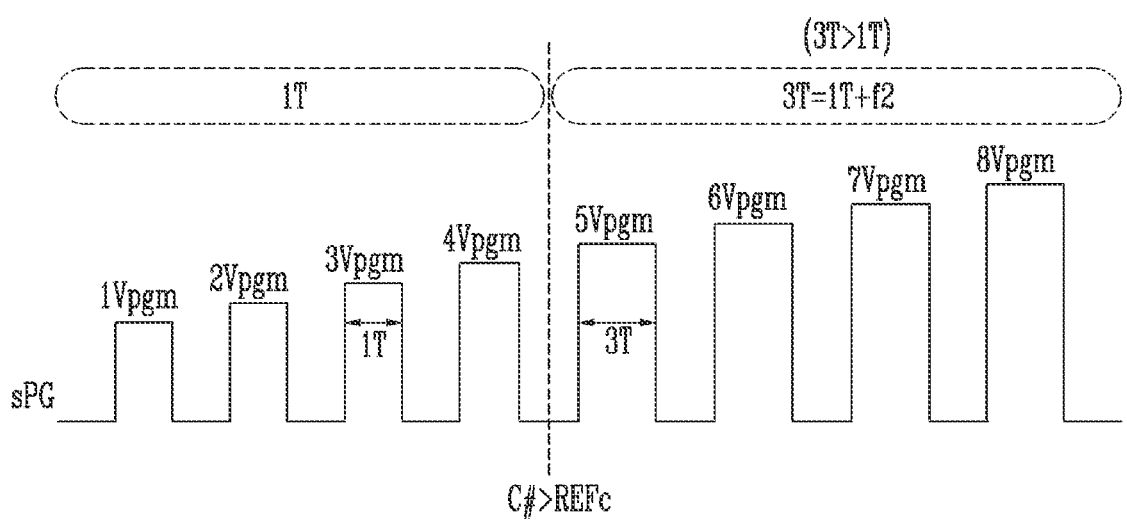

FIGS. 12A to 12C are diagrams illustrating a program method according to a second embodiment of the present disclosure.

Referring to FIG. 12A, when a program operation performed on selected memory cells to be programmed to a reference state is completed at a program operation using a third program voltage 3Vpgm, the memory device may determine a program speed by comparing a pulse count C# used in the program operation on the selected memory cells with a reference pulse count REFc. Here, the third program voltage 3Vpgm may be the voltage used in a program operation during which memory cells are programmed to the reference state, and may be changed depending on the reference state, selected from among all program states, and the program speed of the memory cells.

It is assumed that a program voltage active time corresponding to first to third program voltages 1Vpgm to 3Vpgm is a first time 1T. Here, the program voltage active time may be the time during which the program voltage is applied to a selected word line. When the number of pulses (pulse count) C# for the program voltages, counted at a time point at which the program operation corresponding to the reference state is completed, is equal to the reference pulse count REFc (C#=REFc), the control logic circuit (e.g., 180 of FIG. 10) may determine that the selected page is a normal page nPG. In this case, the control logic circuit 180 may maintain a program voltage active time, corresponding to the fourth to eighth program voltages 4Vpgm to 8Vpgm to be used in the remaining program operations, at the time identical to the first time 1T which is the program voltage active time corresponding to the first to third program voltages 1Vpgm to 3Vpgm.

Referring to FIG. 12B, when first and second program voltages 1Vpgm and 2Vpgm are used in the program operation on the memory cells programmed to the reference state, the pulse count C# for the program voltages used in the program operation is 2, and thus the pulse count C# is less than the reference pulse count REFc (C#<REFc). In this case, the control logic circuit (e.g., 180 of FIG. 10) may determine that the selected page is a fast page fPG. The control logic circuit 180 may change a program voltage active time, corresponding to the third to eighth program voltages 3Vpgm to 8Vpgm to be used subsequent to the second program voltage 2Vpgm, to a second time 2T shorter than the first time 1T. That is, the time during which the third to eighth program voltages 3Vpgm to 8Vpgm are applied to the selected word line is shortened, and thus the speed at which the threshold voltage of a fast cell is increased may be reduced. In an embodiment, the second time 2T may be equal to the first time 1T minus a second offset f2.

Referring to FIG. 12C, when first to fourth program voltages 1Vpgm to 4Vpgm are used in the program operation on the memory cells programmed to the reference state, a pulse count C# for the program voltages used in the program operation is 4, and thus the pulse count C# is greater than the reference pulse count REFc (C#>REFc). In this case, the control logic circuit (e.g., 180 of FIG. 10) may determine that the selected page is a slow page sPG. The control logic circuit 180 may change a program voltage active time, corresponding to the fifth to eighth program voltages 5Vpgm to 8Vpgm to be used subsequent to the fourth program voltage 4Vpgm, to a third time 3T longer than the first time 1T. That is, the program voltage active time corresponding to the fifth to eighth program voltages 5Vpgm to 8Vpgm may be lengthened, and thus the speed at which the threshold voltage of a slow cell is increased may be increased. In an embodiment, the third time 3T may be equal to the first time 1T plus a second offset f2.

Figure 13A:
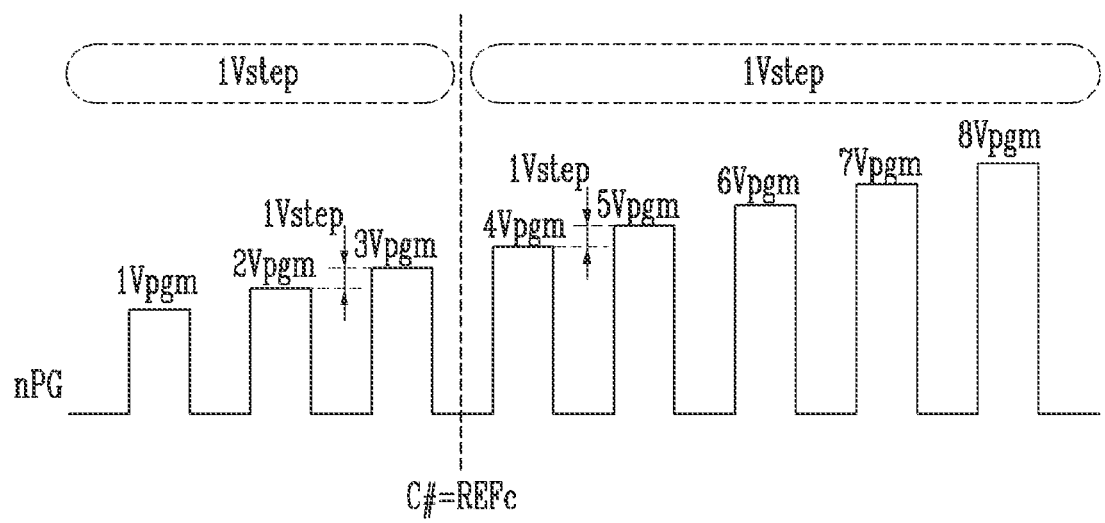
FIGS. 13A, 13B, and 13C are diagrams illustrating a program method according to a third embodiment of the present disclosure.
Figure 13B:
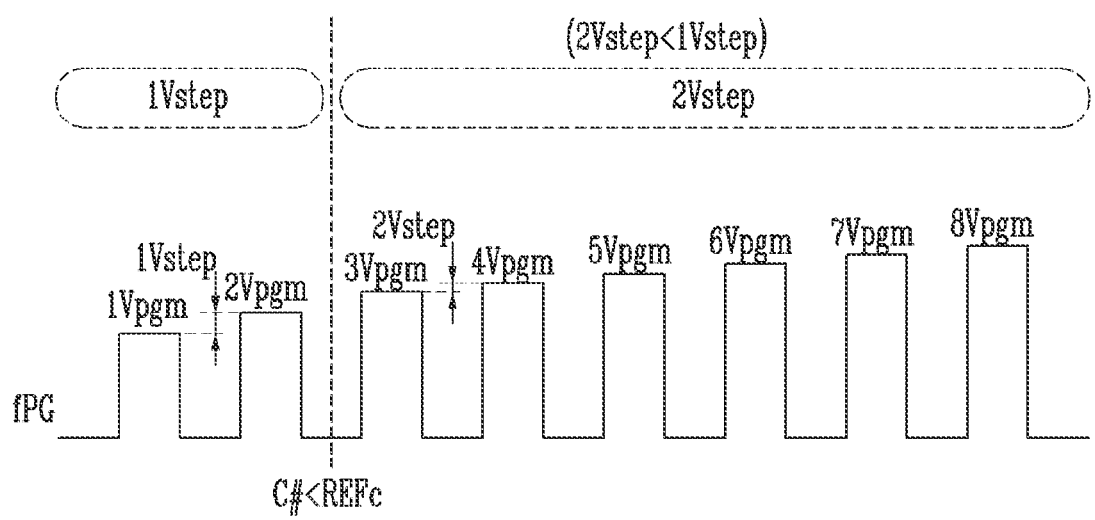
Figure 13C:
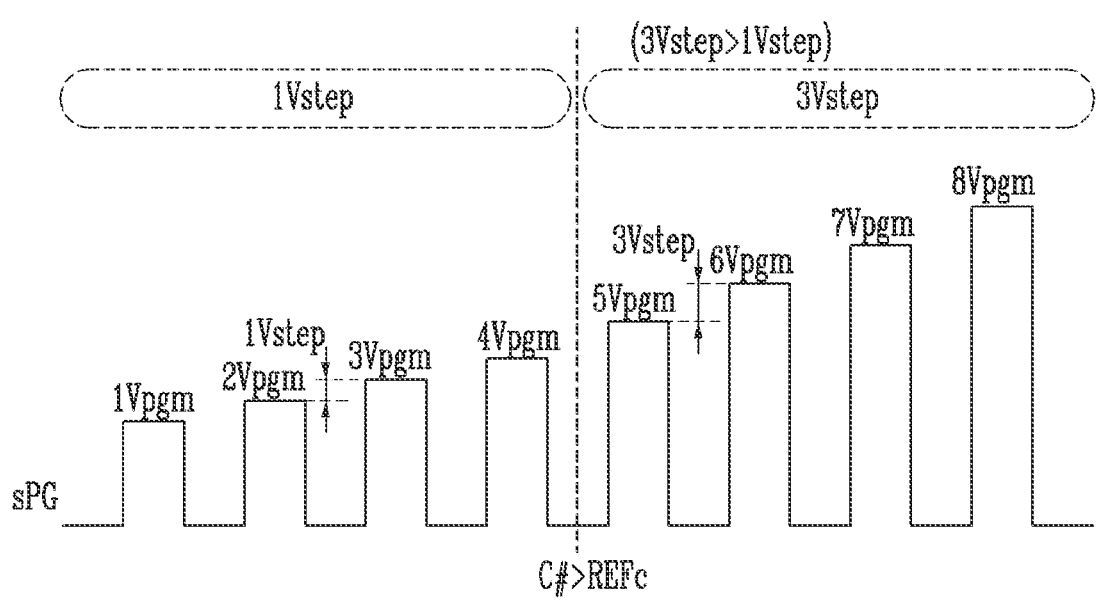

FIGS. 13A to 13C are diagrams illustrating a program method according to a third embodiment of the present disclosure.

Referring to FIG. 13A, when a program operation performed on the selected memory cells to be programmed to a reference state is completed at a program operation using a third program voltage 3Vpgm, the memory device may determine the program speed by comparing a pulse count C# used in the program operation on the selected memory cells with a reference pulse count REFc. Here, since the third program voltage 3Vpgm is only an example provided for the better understanding of the present disclosure, it may be changed according to the memory device.

For example, it is assumed that each of the first to third program voltages 1Vpgm to 3Vpgm is gradually increased by a first step voltage 1Vstep. When the pulse count C # is equal to the reference pulse count REFc (C #=REFc), the control logic circuit (e.g., 180 of FIG. 10) may determine that a selected page is a normal page nPG. In this case, the control logic circuit 180 may also apply the first step voltage 1Vstep to the fourth to eighth program voltages 4Vpgm to 8Vpgm during the remaining program operations to be performed subsequent to the third program voltage 3Vpgm.

Referring to FIG. 13B, when first and second program voltages 1Vpgm and 2Vpgm are used in the program operation on the memory cells programmed to the reference state, a pulse count C# for the program voltages used in the program operation is 2, and thus the pulse count C# is less than the reference pulse count REFc (C#<REFc). In this case, the control logic circuit (e.g., 180 of FIG. 10) may determine that the selected page is a fast page fPG. The control logic circuit 180 may decrease the first step voltage 1Vstep to a second step voltage 2Vstep during a program operation to be performed subsequent to the second program voltage 2Vpgm. For example, because each of the first and second program voltages 1Vpgm and 2Vpgm is gradually increased by the first step voltage 1Vstep, the second step voltage 2Vstep lower than the first step voltage 1Vstep may be applied to the remaining third to eighth program voltages 3Vpgm to 8Vpgm. The second step voltage 2Vstep may be applied to program voltages starting from the third program voltage 3Vpgm or from the fourth program voltage 4Vpgm.

Referring to FIG. 13C, when first to fourth program voltages 1Vpgm to 4Vpgm are used in the program operation on the memory cells programmed to the reference state, a pulse count C# for the program voltages used in the program operation is 4, and thus the pulse count C# is greater than the reference pulse count REFc (C#>REFc). In this case, the control logic circuit (e.g., 180 of FIG. 10) may determine that the selected page is a slow page sPG. The control logic circuit 180 may apply the third step voltage 3Vstep higher than the first step voltage 1Vstep to the remaining program operations to be performed subsequent to the fourth program voltage 4Vpgm. For example, because each of the first to fourth program voltages 1Vpgm to 4Vpgm is gradually increased by the first step voltage 1Vstep, the third step voltage 3Vstep higher than the first step voltage 1Vstep may be applied to the fifth to eighth program voltages 5Vpgm to 8Vpgm during the remaining program operations to be performed after the program speed is determined.

Figure 14A:
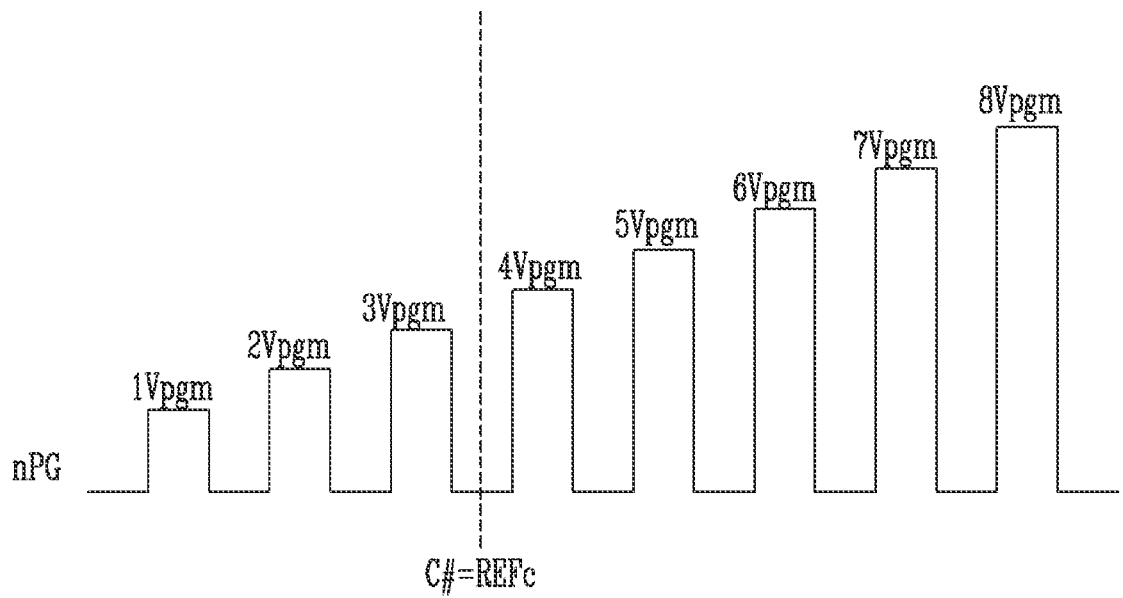
FIGS. 14A, 14B, and 14C are diagrams illustrating a program method according to a fourth embodiment of the present disclosure.
Figure 14B:
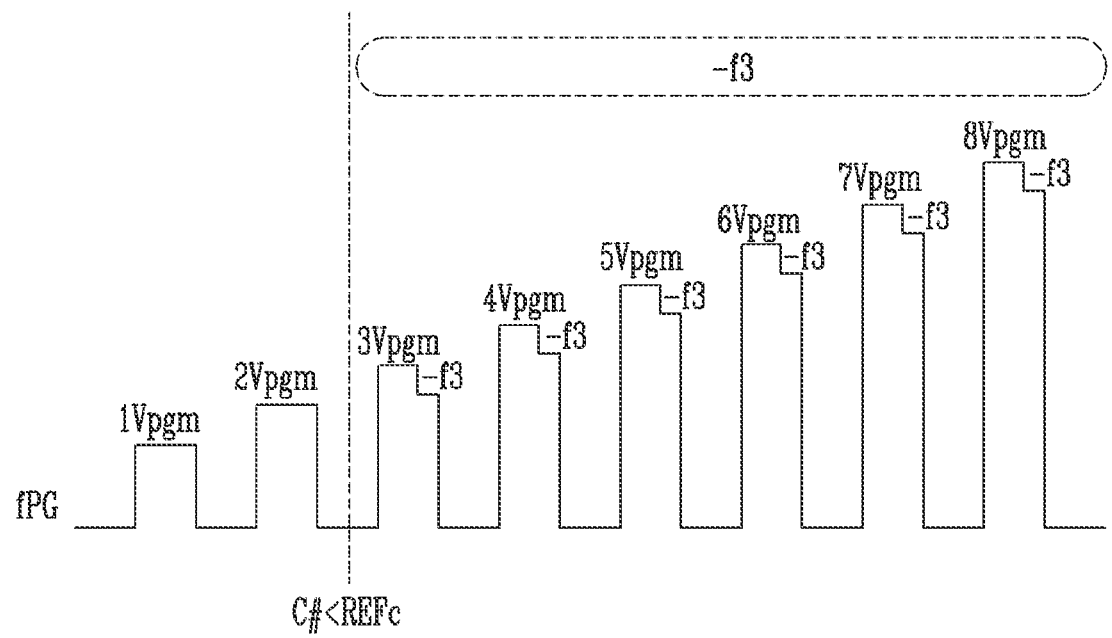
Figure 14C:
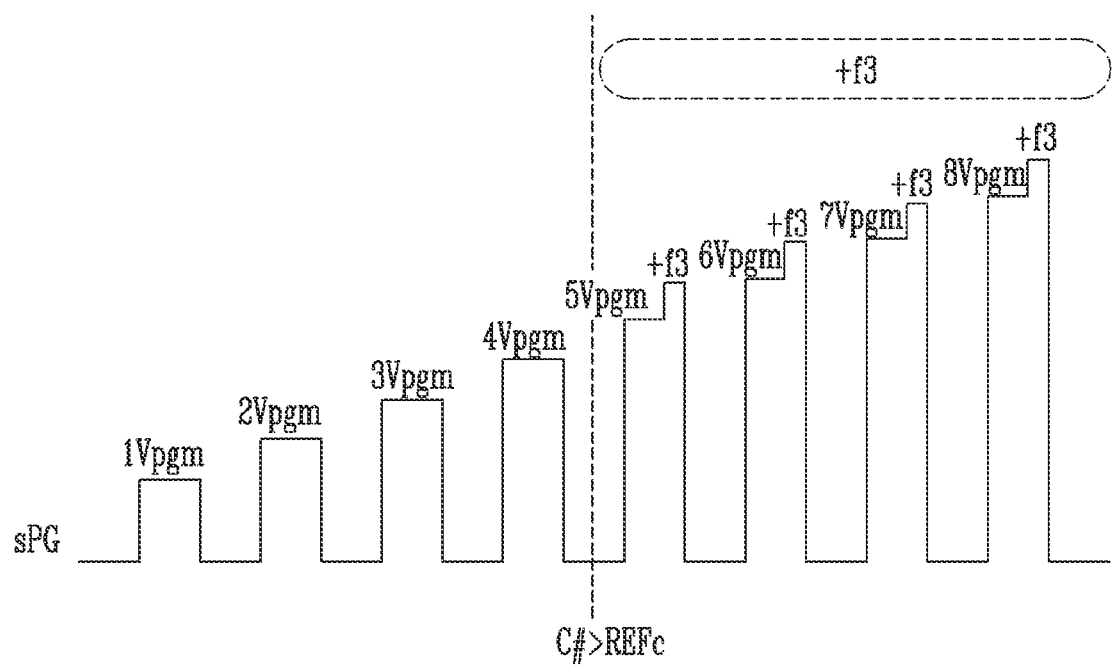

FIGS. 14A to 14C are diagrams illustrating a program method according to a fourth embodiment of the present disclosure.

Referring to FIG. 14A, when a program operation performed on selected memory cells to be programmed to a reference state, among a plurality of program states, is completed at a program operation using a third program voltage 3Vpgm, the memory device may determine a program speed by counting the number of pulses (pulse count) C# for program voltages used in the program operation on the selected memory cells and comparing the pulse count C# with a reference pulse count REFc. Here, since the third program voltage 3Vpgm is only an example provided for the better understanding of the present disclosure, it may be changed depending on the reference state and the program speed of memory cells.

For example, it is assumed that each of the first to third program voltages 1Vpgm to 3Vpgm is gradually increased by a step voltage Vstep. When the pulse count C# for the program voltages, used in the program operation while the memory cells are being programmed to the reference state, is equal to the reference pulse count REFc (C#=REFc), the control logic circuit (e.g., 180 of FIG. 10) may determine that the selected page is a normal page nPG. In this case, the control logic circuit 180 may keep the condition for the remaining program operations at the same condition as a previous program operation. For example, the control logic circuit 180 may keep the same program condition as the initial program condition so that each of fourth to eighth program voltages 4Vpgm to 8Vpgm to be used subsequent to the third program voltage 3Vpgm is gradually increased by a step voltage Vstep.

Referring to FIG. 14B, when first and second program voltages 1Vpgm and 2Vpgm are used in the program operation on the memory cells programmed to the reference state, a pulse count C# for the program voltages used in the program operation is 2, and thus the pulse count C# is less than the reference pulse count REFc (C#<REFc). In this case, the control logic circuit (e.g., 180 of FIG. 10) may determine that the selected page is a fast page fPG. The control logic circuit 180 may apply a third minus offset of −f3 to a program operation to be performed subsequent to the second program voltage 2Vpgm. For example, each of the third to eighth program voltages 3Vpgm to 8Vpgm is increased by the step voltage, and the third minus offset of −f3 may be applied to each of the third to eighth program voltages 3Vpgm to 8Vpgm. For example, when the third program voltage 3Vpgm is applied to a selected word line, the third minus offset of −f3 may be applied to the third program voltage 3Vpgm before the selected word line is discharged, and thus the program voltage may be decreased in steps. For example, when the third minus offset of −f3 is applied to the third program voltage 3Vpgm, the third program voltage 3Vpgm may be applied to the selected word line for a predetermined period of time, after which the program voltage to which the third minus offset of −f3 is applied may be applied thereto. In this way, the third minus offset of −f3 may also be applied to each of the remaining program loops. The word "predetermined" as used herein with respect to a parameter, such as a preset period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Referring to FIG. 14C, when first to fourth program voltages 1Vpgm to 4Vpgm are used in the program operation on the memory cells programmed to the reference state, a pulse count C # for the program voltages used in the program operation is 4, and thus the pulse count C # is greater than the reference pulse count REFc (C #>REFc). In this case, the control logic circuit (e.g., 180 of FIG. 10) may determine that the selected page is a slow page sPG. The control logic circuit 180 may apply a third plus offset of +f3 to a program operation to be performed subsequent to the fourth program voltage 4Vpgm. For example, each of the fifth to eighth program voltages 5Vpgm to 8Vpgm is increased by the step voltage, and the third plus offset of +f3 may be applied to each of the fifth to eighth program voltages 5Vpgm to 8Vpgm. For example, when the fifth program voltage 5Vpgm is applied to a selected word line, the third plus offset of +f3 may be applied to the fifth program voltage 5Vpgm before the selected word line is discharged, and thus the program voltage may be increased. For example, when the third plus offset of +f3 is applied to a program loop in which the fifth program voltage 5Vpgm is set, the fifth program voltage 5Vpgm may be applied to the selected word line for a predetermined period of time, after which the program voltage to which the third plus offset of +f3 is applied may be applied thereto. In this way, the third plus offset of +f3 may be applied to each of the remaining program loops.

Figure 15A:
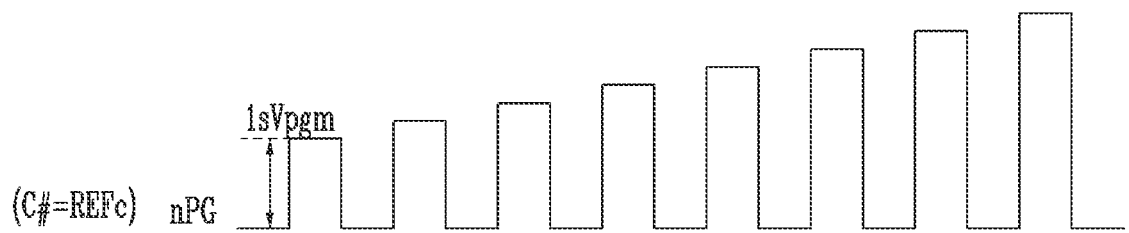
FIGS. 15A, 15B, and 15C are diagrams illustrating a program method according to a fifth embodiment of the present disclosure.
Figure 15B:
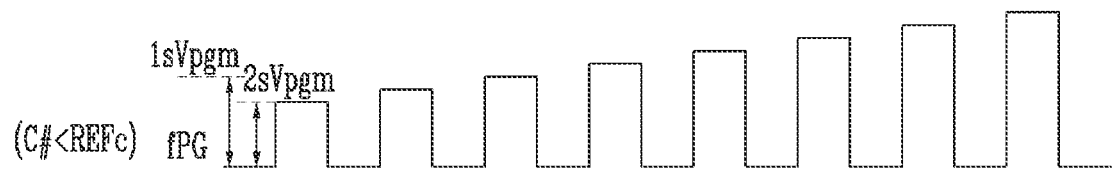
Figure 15C:
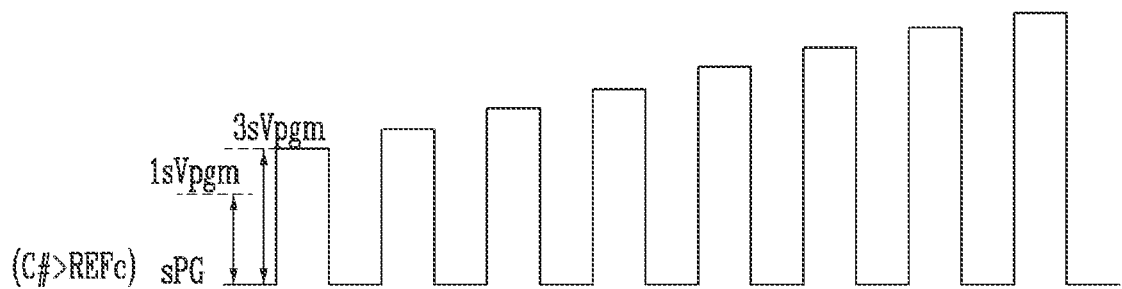

FIGS. 15A to 15C are diagrams illustrating a program method according to a fifth embodiment of the present disclosure.

In FIGS. 15A to 15C, a program condition for a next page may be maintained or changed depending on the speed of selected memory cells in a selected page.

Referring to FIG. 15A, when the number of pulses (pulse count) C#, used in a program operation performed on selected memory cells included in a previous page for which a program operation has been completed, is equal to a reference pulse count REFc (C#=REFc), the control logic circuit (e.g., 180 of FIG. 10) may determine the previous page to be a normal page nPG, and may also determine the next page or the remaining pages to be normal pages nPG. Therefore, the control logic circuit (e.g., 180 of FIG. 10) may maintain a start program voltage for the next page or the remaining pages at a first start program voltage 1sVpgm. Here, the first start program voltage 1sVpgm may be a voltage set as a default in the initial stage of the program operation. When the first start program voltage 1sVpgm is set, the control logic circuit 180 may control a voltage generator (e.g., 130 of FIG. 2) so that program voltages increased by a step voltage from the first start program voltage 1sVpgm are generated.

Referring to FIG. 15B, when the number of pulses (pulse count) C#, used in a program operation performed on selected memory cells included in a previous page, is less than the reference pulse count REFc (C#<REFc), the control logic circuit (e.g., 180 of FIG. 10) may determine the previous page to be a fast page fPG, and may also determine the next page or the remaining pages to be fast pages fPG. Therefore, the control logic circuit (e.g., 180 of FIG. 10) may change the start program voltage to a second start program voltage 2sVpgm lower than the first start program voltage 1sVpgm so that the threshold voltages of the memory cells are increased slower than those of the memory cells in the previous page during a program operation performed on the next page or the remaining pages. When the second start program voltage 2sVpgm is set, the control logic circuit 180 may control the voltage generator (e.g., 130 of FIG. 2) so that program voltages gradually increased by the step voltage from the second start program voltage 2sVpgm are generated.

Referring to FIG. 15C, when the number of pulses (pulse count) C #, used in a program operation performed on selected memory cells included in a previous page, is greater than the reference pulse count REFc (C #>REFc), the control logic circuit (e.g., 180 of FIG. 10) may determine the previous page to be a slow page sPG, and may also determine the next page or the remaining pages to be slow pages sPG. Therefore, the control logic circuit (e.g., 180 of FIG. 10) may change the start program voltage to a third start program voltage 3sVpgm higher than the first start program voltage 1 sVpgm so that the threshold voltages of the memory cells are increased faster than those of the memory cells in the previous page during a program operation performed on the next page or the remaining pages. When the third start program voltage 3sVpgm is set, the control logic circuit 180 may control the voltage generator (e.g., 130 of FIG. 2) so that program voltages gradually increased by the step voltage from the third start program voltage 3sVpgm are generated.

Figure 16A:
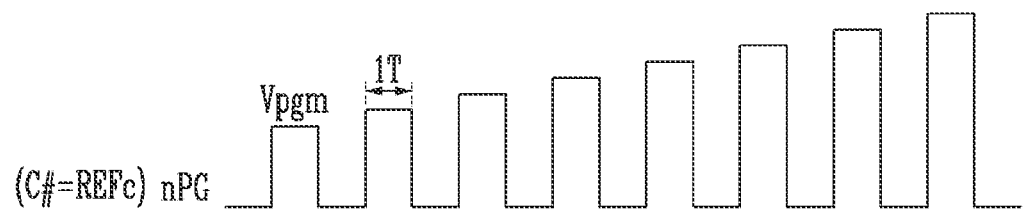
FIGS. 16A, 16B, and 16C are diagrams illustrating a program method according to a sixth embodiment of the present disclosure.
Figure 16B:
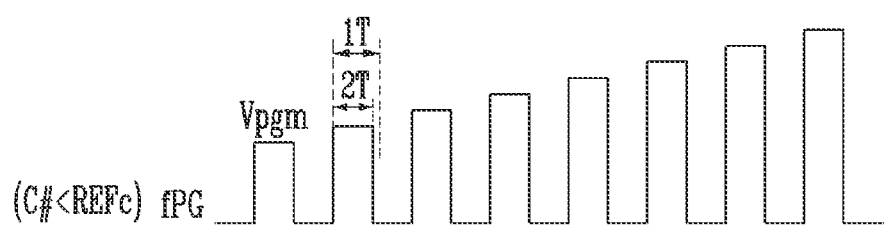
Figure 16C:
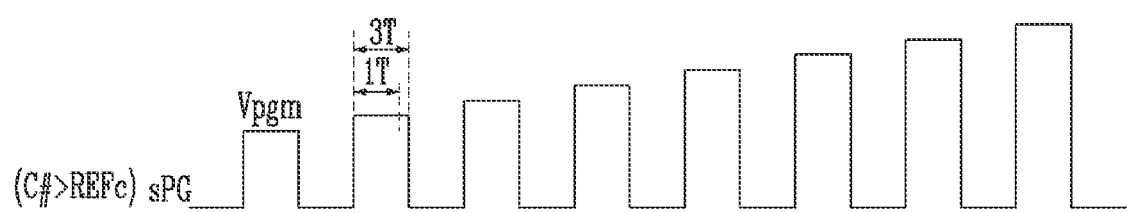

FIGS. 16A to 16C are diagrams illustrating a program method according to a sixth embodiment of the present disclosure.

Referring to FIGS. 16A to 16C, a program condition for a next page may be maintained or changed depending on the speed of selected memory cells in a selected page.

Referring to FIG. 16A, when the number of pulses (pulse count) C#, used in a program operation performed on selected memory cells included in a previous page for which a program operation has been completed, is equal to a reference pulse count REFc (C#=REFc), the control logic circuit (e.g., 180 of FIG. 10) may determine the previous page to be a normal page nPG, and may also determine the next page or the remaining pages to be normal pages nPG. Therefore, the control logic circuit (e.g., 180 of FIG. 10) may maintain a program voltage active time corresponding to the next page or the remaining pages at a first time 1T. Here, the first time 1T may be a time set as a default in the initial stage of the program operation. When the first time 1T is set, the control logic circuit 180 may control a voltage generator (e.g., 130 of FIG. 2) so that the program voltage Vpgm is applied to a selected word line during the first time 1T.

Referring to FIG. 16B, when the number of pulses (pulse count) C#, used in the program operation performed on the selected memory cells included in the previous page, is less than the reference pulse count REFc (C#<REFc), the control logic circuit (e.g., 180 of FIG. 10) may determine the previous page to be a fast page fPG, and may also determine the next page or the remaining pages to be fast pages fPG. Therefore, the control logic circuit (e.g., 180 of FIG. 10) may change the program voltage active time to a second time 2T shorter than the first time 1T so that the threshold voltages of the memory cells are increased slower than those of the memory cells in the previous page during a program operation performed on the next page or the remaining pages. When the second time 2T is set, the control logic circuit 180 may control the voltage generator (e.g., 130 of FIG. 2) so that the program voltage Vpgm is applied to a selected word line during the second time 2T.

Referring to FIG. 16C, when the number of pulses (pulse count) C #, used in the program operation performed on the selected memory cells included in the previous page, is greater than the reference pulse count REFc (C #>REFc), the control logic circuit (e.g., 180 of FIG. 10) may determine the previous page to be a slow page sPG, and may also determine the next page or the remaining pages to be slow pages sPG. Therefore, the control logic circuit (e.g., 180 of FIG. 10) may change the program voltage active time to a third time 3T longer than the first time 1T so that the threshold voltages of the memory cells are increased faster than those of the memory cells in the previous page during a program operation performed on the next page or the remaining pages. When the third time 3T is set, the control logic circuit 180 may control the voltage generator (e.g., 130 of FIG. 2) so that the program voltage Vpgm is applied to a selected word line during the third time 3T.

FIGS. 17 and 18 are diagrams illustrating a program method according to a seventh embodiment of the present disclosure, wherein memory cells or pages may be divided into a plurality of groups depending on the program speed, and a program condition may be controlled for each group.

Referring to FIG. 17, when fast memory cells are included in a selected page, the selected page may be set to a fast page fPG. Since the program speeds of fast memory cells included in the fast page fPG may also differ from each other, the selected page may be set to at least one of first to third fast pages 1/PG to 3/PG depending on the program speeds of the fast memory cells. Although, in FIG. 17, the fast page fPG is divided into three fast pages 1/PG to 3/PG, this is only an example provided for the better understanding of the present embodiment, and thus the number of fast pages is not limited to the example illustrated in FIG. 17.

The step voltage of the first fast page 1/PG may be set to a 2-1-th step voltage 2-1Vstep, the start program voltage sVpgm thereof may be set to a 2-1-th start program voltage 2-1sVpgm, and the program voltage active time thereof may be set to a 2-1-th time 2-1T.

The second fast page 2/PG may include memory cells having a program speed higher than that of the first fast page 1/PG. The step voltage Vstep of the second fast page 2/PG may be set to a 2-2-th step voltage 2-2Vstep lower than the 2-1-th step voltage 2-1Vstep, the start program voltage sVpgm thereof may be set to a 2-2-th start program voltage 2-2sVpgm lower than the 2-1-th start program voltage 2-1sVpgm, and the program voltage active time thereof may be set to a 2-2-th time 2-2T shorter than the 2-1-th time 2-1T.

The third fast page 3/PG may include memory cells having a program speed higher than that of the second fast page 2/PG. The step voltage Vstep of the third fast page 3/PG may be set to a 2-3-th step voltage 2-3Vstep lower than the 2-2-th step voltage 2-2Vstep, the start program voltage sVpgm thereof may be set to a 2-3-th start program voltage 2-3sVpgm lower than the 2-2-th start program voltage 2-2sVpgm, and the program voltage active time thereof may be set to a 2-3-th time 2-3T shorter than the 2-2-th time 2-2T.

Referring to FIG. 18, when slow memory cells are included in a selected page, the selected page may be set to a slow page sPG. Since the program speeds of slow memory cells included in the slow page sPG may also differ from each other, the slow page may be set to at least one of first to third slow pages 1sPG to 3sPG depending on the program speeds of slow memory cells. Although, in FIG. 18, the slow page sPG is divided into three slow pages 1sPG to 3sPG, this is only an example provided for the better understanding of the present embodiment, and the number of slow pages is not limited to the example illustrated in FIG. 18.

The step voltage of the first slow page 1sPG may be set to a 3-1-th step voltage 3-1Vstep, the start program voltage sVpgm thereof may be set to a 3-1-th start program voltage 3-1sVpgm, and the program voltage active time thereof may be set to a 3-1-th time 3-1T.

The second slow page 2sPG may include memory cells having a program speed lower than that of the first slow page 1sPG. The step voltage Vstep of the second slow page 2sPG may be set to a 3-2-th step voltage 3-2Vstep higher than the 3-1-th step voltage 3-1Vstep, the start program voltage sVpgm thereof may be set to a 3-2-th start program voltage 3-2sVpgm higher than the 3-1-th start program voltage 3-1sVpgm, and the program voltage active time thereof may be set to a 3-2-th time 3-2T longer than the 3-1-th time 3-1T.

The third slow page 3sPG may include memory cells having a program speed lower than that of the second slow page 2sPG. The step voltage Vstep of the third slow page 3sPG may be set to a 3-3-th step voltage 3-3Vstep higher than the 3-2-th step voltage 3-2Vstep, the start program voltage sVpgm thereof may be set to a 3-3-th start program voltage 3-3sVpgm higher than the 3-2-th start program voltage 3-2sVpgm, and the program voltage active time thereof may be set to a 3-3-th time 3-3T longer than the 3-2-th time 3-2T.

In the seventh embodiment described with reference to FIG. 17 or 18, although fast or slow pages are identified on a page basis, memory cells may be divided into a plurality of groups even in the same page, and a program condition may be changed depending on the program speed of each group.

Figure 19:
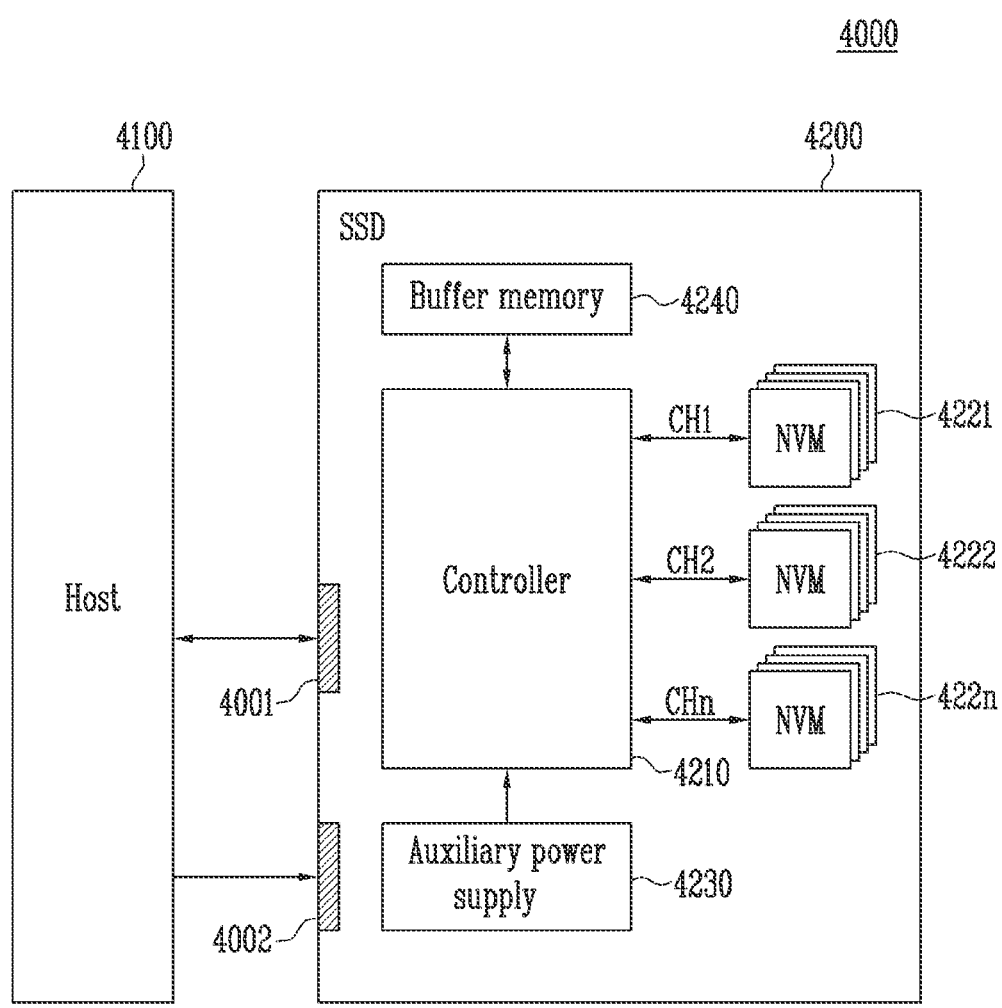
FIG. 19 is a diagram illustrating a solid state drive (SSD) system to which a memory device according to the present disclosure is applied.

FIG. 19 is a diagram illustrating a solid state drive (SSD) system to which a memory device according to the present disclosure is applied.

Referring to FIG. 19, an SSD system 4000 may include a host 4100 and an SSD 4200. The SSD 4200 may exchange a signal with the host 4100 through a signal connector 4001, and may be supplied with power through a power connector 4002. The SSD 4200 may include a controller 4210, a plurality of flash memories 4221 to 422n, an auxiliary power supply 4230, and a buffer memory 4240.

In accordance with an embodiment of the present disclosure, each of the flash memories 4221 to 422n may be configured in the same manner as the memory device 1100 described with reference to FIG. 2.

The controller 4210 may control the plurality of flash memories 4221 to 422n in response to signals received from the host 4100. In an embodiment, the signals may be signals based on the interfaces of the host 4100 and the SSD 4200. For example, such a signal may be a signal defined by at least one of various interfaces such as universal serial bus (USB), multimedia card (MMC), embedded MMC (eMMC), peripheral component interconnection (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe) interfaces.

The auxiliary power supply 4230 may be coupled to the host 4100 through the power connector 4002. The auxiliary power supply 4230 may be supplied with a supply voltage from the host 4100, and may be charged with the supply voltage. The auxiliary power supply 4230 may provide the supply voltage to the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located in a main board, and may also provide auxiliary power to the SSD 4200.

The buffer memory 4240 may be used as a buffer memory of the SSD 4200. For example, the buffer memory 4240 may temporarily store data received from the host 4100 or data received from the plurality of flash memories 4221 to 422n, or may temporarily store metadata (e.g., mapping tables) of the flash memories 4221 to 422n. The buffer memory 4240 may include volatile memories, such as a dynamic random access memory (DRAM), a synchronous DRAM (SDRAM), a double data rate (DDR) SDRAM, and a low power DDR (LPDDR) SDRAM, or nonvolatile memories, such as a ferroelectric RAM (FRAM), a resistive RAM (ReRAM), a spin transfer torque magnetic RAM (STT-MRAM), and a phase-change RAM (PRAM).

Figure 20:
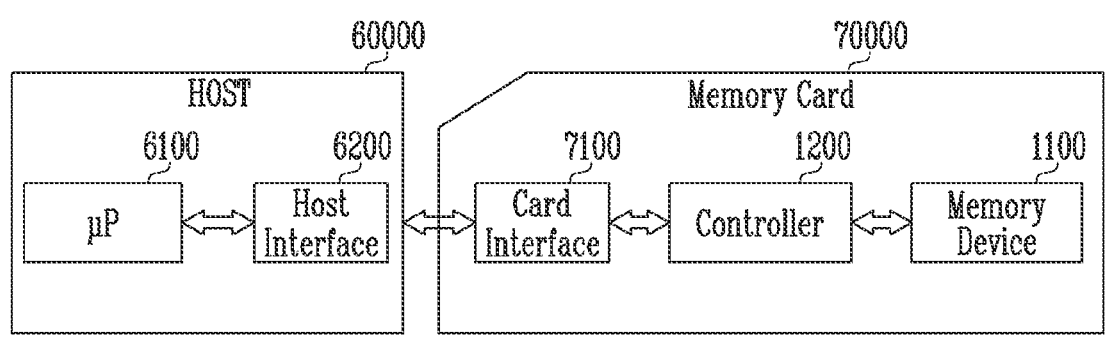
FIG. 20 is a diagram illustrating a memory card system to which a memory device according to the present disclosure is applied.

FIG. 20 is a diagram illustrating a memory card system to which a memory device according to the present disclosure is applied.

Referring to FIG. 20, a memory system 70000 may be implemented as a memory card or a smart card. The memory system 70000 may include a memory device 1100, a controller 1200, and a card interface 7100.

The memory device 1100 may be configured in the same manner as the memory device 1100 illustrated in FIG. 2.

The controller 1200 may control data exchange between the memory device 1100 and the card interface 7100. In an embodiment, the card interface 7100 may be, but is not limited to, a secure digital (SD) card interface or a multimedia card (MMC) interface.

The card interface 7100 may interface data exchange between a host 60000 and the controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method supported by the card interface 7100.

When the memory system 70000 is coupled to a host interface 6200 of the host 60000 such as a PC, a tablet PC, a digital camera, a digital audio player, a mobile phone, console video game hardware or a digital set-top box, the host interface 6200 may perform data communication with the memory device 1100 through the card interface 7100 and the controller 1200 under the control of a microprocessor (µP) 6100.

In accordance with various embodiments, the reliability of a program operation of a memory device may be improved.

What is claimed is:

1. A memory device, comprising:
   a plurality of memory cells configured to store data;
   a voltage generator configured to apply program voltages to a word line coupled to the plurality of memory cells during a program operation in which the plurality of memory cells are programmed to a plurality of program states;
   a cell speed determiner configured to determine a program speed of the plurality of memory cells depending on a number of pulses for the program voltages applied to the word line while the program operation is being performed; and
   a program manager configured to change a condition for remaining program operations depending on the program speed determined by the cell speed determiner,
   wherein the program manager is configured to:
   generate an operation code so that at least one of a level of each program voltage, an active time of the program voltage, a level of a step voltage for the program voltage, at least one of offsets for the program voltage that are included in the condition for the remaining program operations, and a verify voltage is controlled depending on the program speed determined by the cell speed determiner, and
   transmit the operation code to the voltage generator.

2. The memory device according to claim 1, further comprising:
   page buffers configured to store verification data depending on one of voltages and currents of a plurality of bit lines coupled to the plurality of memory cells during a verify operation performed in the program operation.

3. The memory device according to claim 2, further comprising:
   a sensing circuit configured to, when a number of fail bits included in the verification data is greater than an allowable number of fail bits, output a fail signal, and when the number of fail bits is less than or equal to the allowable number of fail bits, output a pass signal.

4. The memory device according to claim 1, wherein the cell speed determiner is configured to:
   compare a pulse count of the program voltages used to perform programming to a reference state selected from among target program states of the plurality of memory cells with a reference pulse count, and
   output a determination result as a result of the comparison.

5. The memory device according to claim 4, wherein the cell speed determiner is configured to, when the pulse count is equal to the reference pulse count,
   determine the program speed of the plurality of memory cells to be normal, and
   output the determination result including information about a normal program speed.

6. The memory device according to claim 4, wherein the cell speed determiner is configured to, when the pulse count is less than the reference pulse count,
   determine the program speed of the plurality of memory cells to be fast, and
   output the determination result including information about a fast program speed.

7. The memory device according to claim 4, wherein the cell speed determiner is configured to, when the pulse count is greater than the reference pulse count,
   determine the program speed of the plurality of memory cells to be slow, and
   output the determination result including information about a slow program speed.

8. The memory device according to claim 1, wherein:
   each program voltage is set to a voltage for increasing threshold voltages of memory cells selected from among the plurality of memory cells,
   the active time of the program voltage is set to a time during which the program voltage is applied to the word line to increase the threshold voltages of the selected memory cells,
   the step voltage is set to a voltage difference between a previous program voltage and a next program voltage when the program voltage is increased, and
   the offsets are used to decrease or increase levels of a part or all of program voltages during the remaining program operations.

9. The memory device according to claim 1, wherein the program manager is configured to, when the program speed is determined to be normal, generate the operation code so that the level of each program voltage, the active time of the program voltage, and the level of the step voltage are maintained at initially set values.

10. The memory device according to claim 1, wherein the program manager is configured to perform at least one of, when the program speed is determined to be fast,
    generate the operation code so that a minus offset is applied to each program voltage,
    generate the operation code so that at least one of the active time of the program voltage and the level of the step voltage is decreased from an initially set value, and
    generate the operation code so that, after the program voltage is applied to the word line, the minus offset is applied to the program voltage.

11. The memory device according to claim 1, wherein the program manager is configured to perform at least one of, when the program speed is determined to be slow, generate the operation code so that a plus offset is applied to each program voltage, generate the operation code so that at least one of the active time of the program voltage and the level of the step voltage is increased from an initially set value, and generate the operation code so that, after the program voltage is applied to the word line, the plus offset is applied to the program voltage.

12. A memory device, comprising:

a plurality of memory cells included in a selected page;

a control logic circuit configured to determine a program speed at a time at which memory cells selected from among the plurality of memory cells are programmed to a reference state, among different target program states, while the plurality of memory cells are being programmed to the different target program states, and to change a condition for a program operation based on the determined program speed; and a voltage generator configured to output program voltages so that remaining program operations are performed under control of the control logic circuit, wherein the control logic circuit is configured to control a condition of at least one of a level of each program voltage, a level of a step voltage, an active time during which the program voltage is applied to a word line, an offset for the program voltage, and a verify voltage depending on the program speed of the memory cells programmed to the reference state during the program operation, and to generate and output an operation code to which the controlled condition is applied during the remaining program operations.

13. The memory device according to claim 12, wherein the reference state is set among the target program states except a lowest program state and a highest program state.

14. The memory device according to claim 12, wherein the control logic circuit is configured to, when the program speed of the selected memory cells programmed to the reference state is determined to be a normal program speed, maintain the program voltage, the step voltage, and the active time of the program operation.

15. The memory device according to claim 12, wherein the control logic circuit is configured to, when the program speed of the selected memory cells programmed to the reference state is determined to be a fast program speed higher than a normal program speed, control the voltage generator so that the remaining program operations are performed by, at least one of, applying a minus offset to the program voltage, decreasing the level of the step voltage from a previous level, and by decreasing the active time.

16. The memory device according to claim 12, wherein the control logic circuit is configured to, when the program speed of the selected memory cells programmed to the reference state is determined to be a slow program speed lower than a normal program speed, control the voltage generator so that the remaining program operations are performed by, at least one of, applying a plus offset to the program voltage, increasing the level of the step voltage from a previous level, and increasing the active time.

\* \* \* \* \*